US006801106B2

(12) United States Patent
Ono et al.

(10) Patent No.: US 6,801,106 B2
(45) Date of Patent: Oct. 5, 2004

(54) DIELECTRIC ELECTRONIC COMPONENT AND METHOD OF ADJUSTING INPUT/OUTPUT COUPLING THEREOF

(75) Inventors: Shoji Ono, Ise (JP); Hidefumi Suzuki, Ise (JP); Yukihiro Hamaguchi, Watarai-gun (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/397,250

(22) Filed: Mar. 27, 2003

(65) Prior Publication Data

US 2003/0184416 A1 Oct. 2, 2003

(30) Foreign Application Priority Data

Mar. 29, 2002 (JP) ....................................... 2002-096593
Mar. 29, 2002 (JP) ....................................... 2002-096773
Mar. 29, 2002 (JP) ....................................... 2002-096841

(51) Int. Cl.[7] .................................................. H03P 1/20
(52) U.S. Cl. ....................................... 333/206; 333/202
(58) Field of Search ................................ 333/202, 206, 333/222

(56) References Cited

U.S. PATENT DOCUMENTS

| | | | | | |
|---|---|---|---|---|---|
| 5,905,420 | A | * | 5/1999 | Tsujiguchi et al. .......... | 333/206 |
| 6,549,095 | B2 | * | 4/2003 | Tsukamoto et al. .......... | 333/206 |
| 2002/0030558 | A1 | | 3/2002 | Tsukamoto et al. .......... | 333/206 |

FOREIGN PATENT DOCUMENTS

| | | | |
|---|---|---|---|
| EP | 0 444 948 | A3 | 9/1991 |
| EP | 0 688 059 | A1 | 12/1995 |
| GB | 2 374 985 | A | 10/2002 |
| JP | 08-065012 | | 3/1996 |

* cited by examiner

*Primary Examiner*—Long Nguyen
(74) *Attorney, Agent, or Firm*—Stites & Harbison PLLC; Ross F. Hunt, Jr.

(57) ABSTRACT

The extent of input/output coupling of a dielectric electronic component such as a dielectric filter or a dielectric duplexer can be adjusted by a novel method. The dielectric filter 1 comprises excitation holes whose short-circuiting ends are provided with respective coupling-adjusting countersinks.

24 Claims, 19 Drawing Sheets

DIELECTRIC ELECTRONIC COMPONENT AND METHOD OF ADJUSTING INPUT/OUTPUT COUPLING THEREOF

BACKGROUND OF THE INVENTION

1. Field of the Invention

The present invention relates to a dielectric electronic component such as a dielectric filter or a dielectric duplexer including a plurality of resonators arranged in parallel and adapted to use in a mobile communication device such as a cellular telephone.

2. Description of the Related Art

Conventional dielectric electronic components include a dielectric filter having a configuration as described below.

Referring to FIG. 1 of the accompanying drawings, the dielectric filter F comprises a substantially rectangularly parallelepipedic dielectric ceramic block B, resonators r1 and r2 arranged in parallel in a given direction and excitation holes t1 and t2 arranged at the opposite outer lateral sides of the resonators r1 and r2. Each of the resonators r1 and r2 includes a through hole provided in the dielectric ceramic block B, each through hole having an inner peripheral surface coated with an internal conductor. Each of the excitation holes t1 and t2 has an inner peripheral surface coated with an internal conductor.

The top surface e of the dielectric ceramic block B defines the open-circuiting ends a1 and a2 of the resonators r1 and r2 and the short-circuiting ends b1 and b2 of the excitation holes t1 and t2. The bottom surface f of the dielectric ceramic block B defines the short-circuiting ends of the resonators r1 and r2 and the open-circuiting ends of the excitation holes t1 and t2. Then, the outer surfaces of the dielectric block B are coated with an external conductor g by means of a known technique such as screen printing except regions surrounding the open-circuiting ends a1 and a2 of the resonators r1 and r2 and those surrounding the open-circuiting ends of the excitation holes t1 and t2. Therefore, the resonators r1 and r2 and the excitation holes t1 and t2 are connected to the external conductor g at the short-circuiting ends thereof and isolated from the external conductor g by respective insulating sections at the open-circuiting ends thereof.

The length of the resonators r1 and r2, or the resonance length, is made substantially equal to ¼ of the resonance wavelength λ. The resonator r1 and the excitation hole t1 are electromagnetically coupled. So are the resonator r2 and the excitation hole t2. An input/output pad P1 is formed at a position close to the open-circuiting end of the excitation hole t1 on a lateral surface of the dielectric ceramic block B as extension of the internal conductor of the excitation hole t1. Similarly, another input/output pad P2 is formed at a position close to the open-circuiting end of the excitation hole t2 on the same lateral surface of the dielectric ceramic block B as extension of the internal conductor of the excitation hole t2. The input/output pads P1 and P2 are formed isolated from the external conductor g.

Meanwhile, dielectric filters having the above described configuration are always required to show a desired reflection characteristic. It is necessary to adjust the extent of input/output coupling in order to acquire a desired reflection characteristic. Known means for adjusting the extent of input/output coupling include those that are adapted to do so by regulating the diameter and the positions of the excitation holes.

In the dielectric filter F having the above described configuration, the internal conductors of the excitation holes t1 and t2 are formed normally by drawing an electrically conductive material from an end of each of the excitation holes by vacuum and applying the conductive material to the inner peripheral surfaces of the excitation holes. On the other hand, the external conductor g is laid on the short-circuiting end facets of the top surface e of the dielectric ceramic block B where the short-circuiting ends b1 and b2 of the excitation holes t1 and t2 are formed. This external conductor g is normally produced by a known printing technique such as screen printing.

However, to meet the demand for down-sized devices that has remarkably increased in recent years, dielectric filters are required to show reduced dimensions. Under these circumstances, it is often difficult to modify the diameter of the excitation holes to a desired value and hence it is no longer possible to adjust the extent of input/output coupling over a wide range in a dielectric filter. Then, such a dielectric filter can find only a limited scope of application. Dielectric duplexers face similar problems.

Additionally, known dielectric filters having the above described configuration are accompanied by a problem of a large number of manufacturing steps and high manufacturing cost because they are manufactured by forming internal conductors on the excitation holes and external conductors on the short-circuiting end facets of the excitation holes independently in separate respective printing steps. Furthermore, there are occasions where each of the internal conductors of the excitation holes desirably has a given thickness in a given region thereof. There are also occasions where they desirably have a given surface area. Again, dielectric duplexers face similar problems.

SUMMARY OF THE INVENTION

In view of the above identified problems, it is therefore the object of the present invention to provide a dielectric electronic component such as a dielectric filter or a dielectric duplexer that can dissolve those problems.

In an aspect of the invention, the above object is achieved by providing a dielectric electronic component for a communication device comprising:

- a plurality of resonators provided in a dielectric ceramic block, each of which includes a through hole bored through the dielectric ceramic block and having an inner peripheral surface coated with an internal conductor;
- a plurality of excitation holes formed in the dielectric ceramic block and electromagnetically coupled with the resonators, each of which has an inner peripheral surface coated with an internal conductor, said resonators and said excitation holes being arranged in parallel;
- the dielectric ceramic block having a top surface on which open-circuiting ends of the resonators and short-circuiting ends of the excitation holes are defined;
- the dielectric ceramic block having a bottom surface on which short-circuiting ends of the resonators and the open-circuiting ends of the excitation holes are defined;
- the dielectric ceramic block having an outer peripheral surface coated with an external conductor except regions surrounding the open-circuiting ends of the resonators and those of the excitation holes; and
- the short-circuiting ends of the excitation holes being provided with respective coupling-adjusting countersinks showing an increased diameter.

With the above defined arrangement, the input/output coupling of the dielectric electronic component can be weakened without raising the outer dimensions of the dielectric electronic component.

In another aspect of the present invention, there is provided a dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the open-circuiting ends of the excitation holes being provided with respective coupling-adjusting countersinks each having an increased diameter.

With the above defined arrangement, the input/output coupling of the dielectric electronic component can be strengthened without raising the outer dimensions of the dielectric electronic component.

According to another aspect of the invention, there is also provided a method of adjusting a coupling of a dielectric electronic component such as a dielectric filter or a dielectric duplexer by modifying the depth of the countersinks provided for the purpose of adjusting the extent of coupling.

With such a method, it is possible to adjust the extent of input/output coupling of a dielectric electronic component without raising the outer dimensions of the dielectric electronic component.

In another aspect of the present invention, there is provided a dielectric electronic component such as a dielectric filter or a dielectric duplexer comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the top surface of the dielectric ceramic block including an open-circuiting end facet defining the open-circuiting ends of the resonators and coupling-adjusting setback facets, said setback facets being recessed by a predetermined distance from the top surface and defining short-circuiting ends of the excitation holes.

With the above defined arrangement, again the input/output coupling of the dielectric electronic component can be weakened without raising the outer dimensions of the dielectric electronic component.

In another aspect of the present invention, there is provided a dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the bottom surface of the dielectric ceramic block including a short-circuiting end facet defining the short-circuiting ends of the resonators and coupling-adjusting setback facets, said setback facets being recessed by a predetermined distance from the bottom surface and defining open-circuiting ends of the excitation holes.

With the above defined arrangement, again the input/output coupling of the dielectric electronic component can be strengthened without raising the outer dimensions of the dielectric electronic component.

According to a further aspect of the present invention, there is also provided a method of adjusting coupling of a dielectric electronic component such as a dielectric filter or a dielectric duplexer by modifying the depth of the setback facets provided for the purpose of adjusting the extent of coupling. With such a method, it is possible to adjust the extent of input/output coupling of a dielectric electronic component without raising the outer dimensions of the dielectric electronic component.

In another aspect of the present invention, there is provided a dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel;

either a top surface or a bottom surface of the dielectric ceramic block being provided with open-circuiting ends of the resonators and short-circuiting ends of the excitation holes;

either the bottom surface or the top surface, whichever appropriate, of the dielectric ceramic block being provided with short-circuiting ends of the resonators and the open-circuiting ends of the excitation holes;

an outer peripheral surface of the dielectric ceramic block being coated with an external conductor except regions surrounding the open-circuiting ends of the resonators and those of the excitation holes; and either the top surface or the bottom surface, whichever appropriate, of the dielectric ceramic block including an open-circuiting end facet that defines the open-circuiting ends of the resonators and setback facets to be coated with a conductor, said setback facets being recessed by a predetermined distance from the top surface or the bottom surface, whichever appropriate, and defining short-circuiting ends of the excitation holes.

With the above defined arrangement, it is possible to integrate the step of forming internal conductors respectively on the inner peripheral surfaces of the excitation holes and the step of forming external conductors respectively on the setback facets to be coated with a conductor that define the short-circuiting ends of the excitation holes. For example, an electrically conductive material such as silver paste is drawn by vacuum from the open-circuiting end toward the short-circuiting end of each of the excitation holes to form an internal conductor on the inner peripheral surface thereof. The electrically conductive material that gets to the end of the excitation hole, which becomes a short-circuiting end, will flow on the surface of the setback facet. The surface of the setback facet is perpendicular relative to the inner peripheral surface of the excitation hole. In this way, an external conductor is formed. Therefore, the internal conductors of the excitation holes and the external conductors surrounding the short-circuiting ends of the excitation holes can be formed in the step of drawing an electrically conductive material by vacuum. Thus, the printing step is simplified in the case of the above arrangement because the surface areas where the external conductors are formed are clearly defined.

In a dielectric electronic component as defined above, it may additionally be so arranged that the open-circuiting ends of the excitation holes are provided with respective countersinks to be coated with a conductor that show an increased diameter in either the bottom surface or the top surface, whichever appropriate, of the dielectric ceramic block. With this arrangement, the entire surface area of the internal conductors formed on the inner peripheral surfaces of the excitation holes is enlarged if compared with an arrangement without countersinks to be coated with a conductor. In other words, the effective length of the excitation holes is increased. Internal conductors can be formed at desired locations to a desired thickness and the surface area of the internal conductors can be regulated by appropriately selecting a depth, a diameter and a profile for the countersinks to be coated with a conductor. In other words, it is possible to regulate the effective length of the excitation holes.

In another aspect of the present invention, there is provided a dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel;

either a top surface or a bottom surface of the dielectric ceramic block being provided with open-circuiting ends of the resonators and short-circuiting ends of the excitation holes;

either the bottom surface or the top surface, whichever appropriate, of the dielectric ceramic block being provided with short-circuiting ends of the resonators and the open-circuiting ends of the excitation holes;

an outer peripheral surface of the dielectric ceramic block being coated with an external conductor except regions surrounding the open-circuiting ends of the resonators and those of the excitation holes; and one of the opposite ends of each of the excitation holes being provided with a countersink to be coated with a conductor showing an increased diameter.

With the above arrangement, the surface area of the internal conductors of the excitation holes can be enlarged because the inner peripheral surfaces of the countersinks to be coated with a conductor are also provided with an internal conductor. Thus, according to the invention, internal conductors can be formed in desired conditions by appropriately selecting a depth, a diameter and a profile for the countersinks to be coated with a conductor. In other words, it is possible to regulate the effective length of the excitation holes.

In a dielectric electronic component as defined above, it may additionally be so arranged that both the short-circuiting end and the open-circuiting end of the opposite ends of each of the excitation holes are provided with a countersink to be coated with a conductor that shows an increased diameter. With this arrangement, it is possible to form an internal conductor at both the short-circuiting end and the open-circuiting end of each of the excitation holes in desired conditions. Additionally, since countersinks to be coated with a conductor are formed in the inside of the dielectric ceramic block, the outer profile of the dielectric ceramic block is prevented from becoming uneven. Therefore, a known printing technique such as screen printing can advantageously be used for coating the outer surfaces of the dielectric ceramic block with an external conductor.

As pointed out above, a dielectric electronic component according to the invention is typically a dielectric filter or a dielectric duplexer.

DESCRIPTION OF THE PREFERRED EMBODIMENTS

Now, the present invention will be described in greater detail by referring to the accompanying drawings that illustrate preferable embodiments of dielectric electronic component according to the invention.

FIGS. 3, 4, 5 and 6 illustrate a dielectric filter F1 according to the first embodiment of the present invention.

Figure 3:
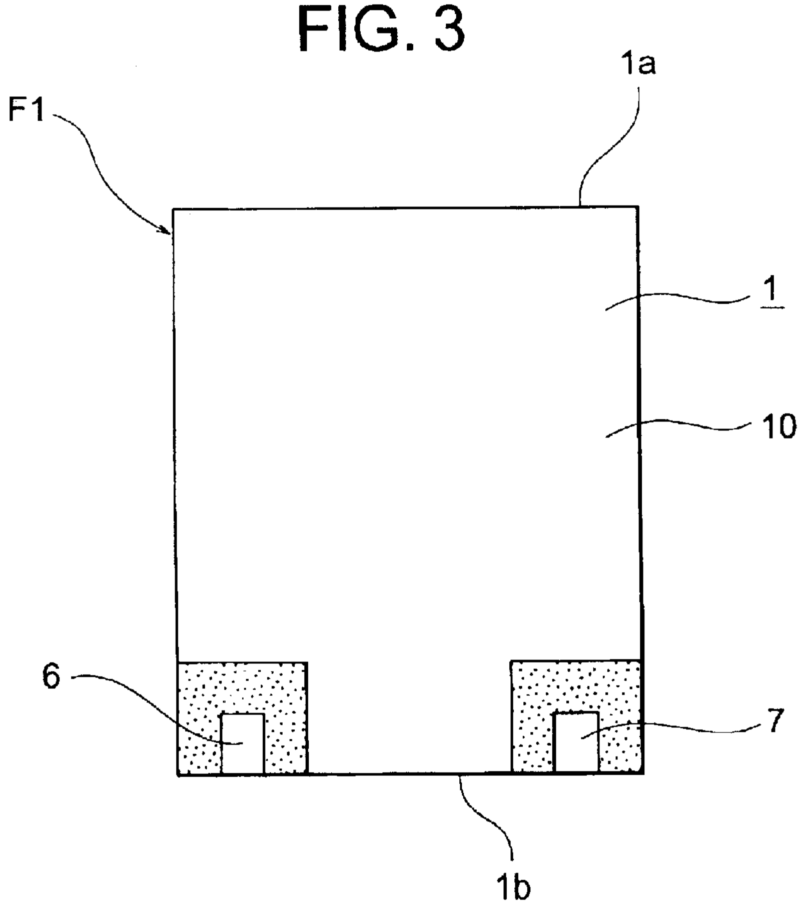
FIG. 3 is a schematic front view showing the first embodiment of a dielectric filter F1 according to the invention.
Figure 4:
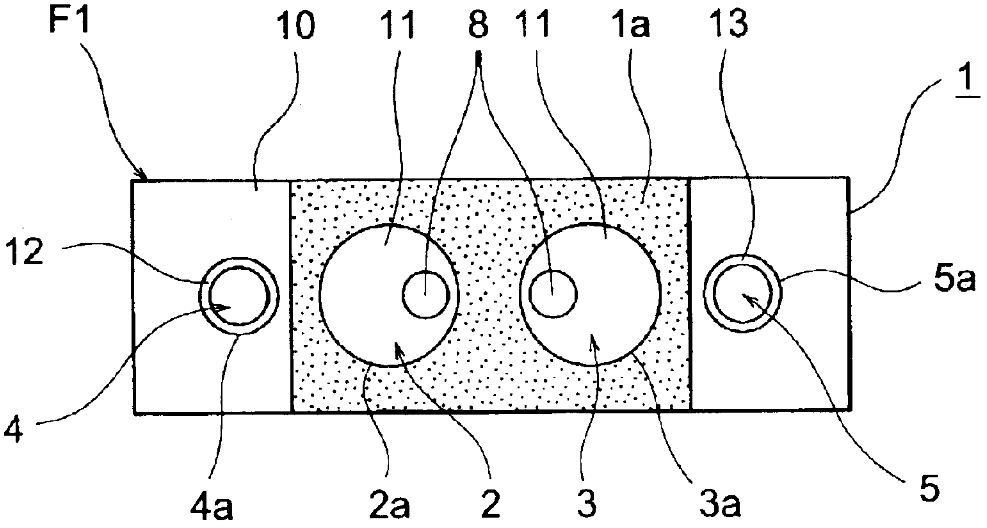
FIG. 4 is a schematic top view of the dielectric filter F1 according to the first embodiment of the invention.
Figure 5:
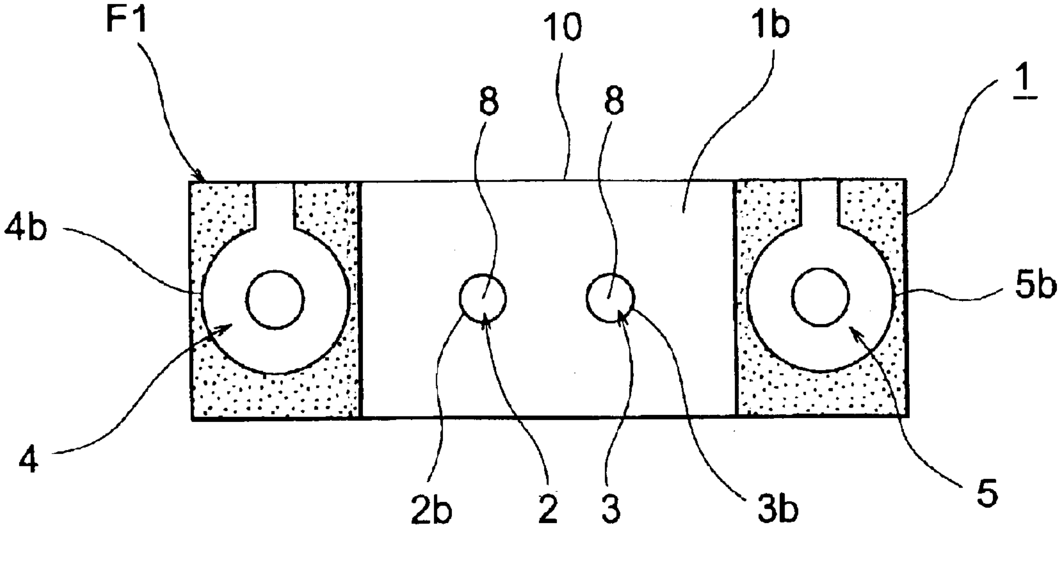
FIG. 5 is a schematic bottom view of the dielectric filter F1 according to the first embodiment of the invention.

As shown in FIGS. 3 through 5, the dielectric filter F1 comprises a dielectric ceramic block 1, a pair of resonators 2 and 3, a pair of excitation holes 4 and 5 and a pair of input/output pads 6 and 7.

Figure 6:
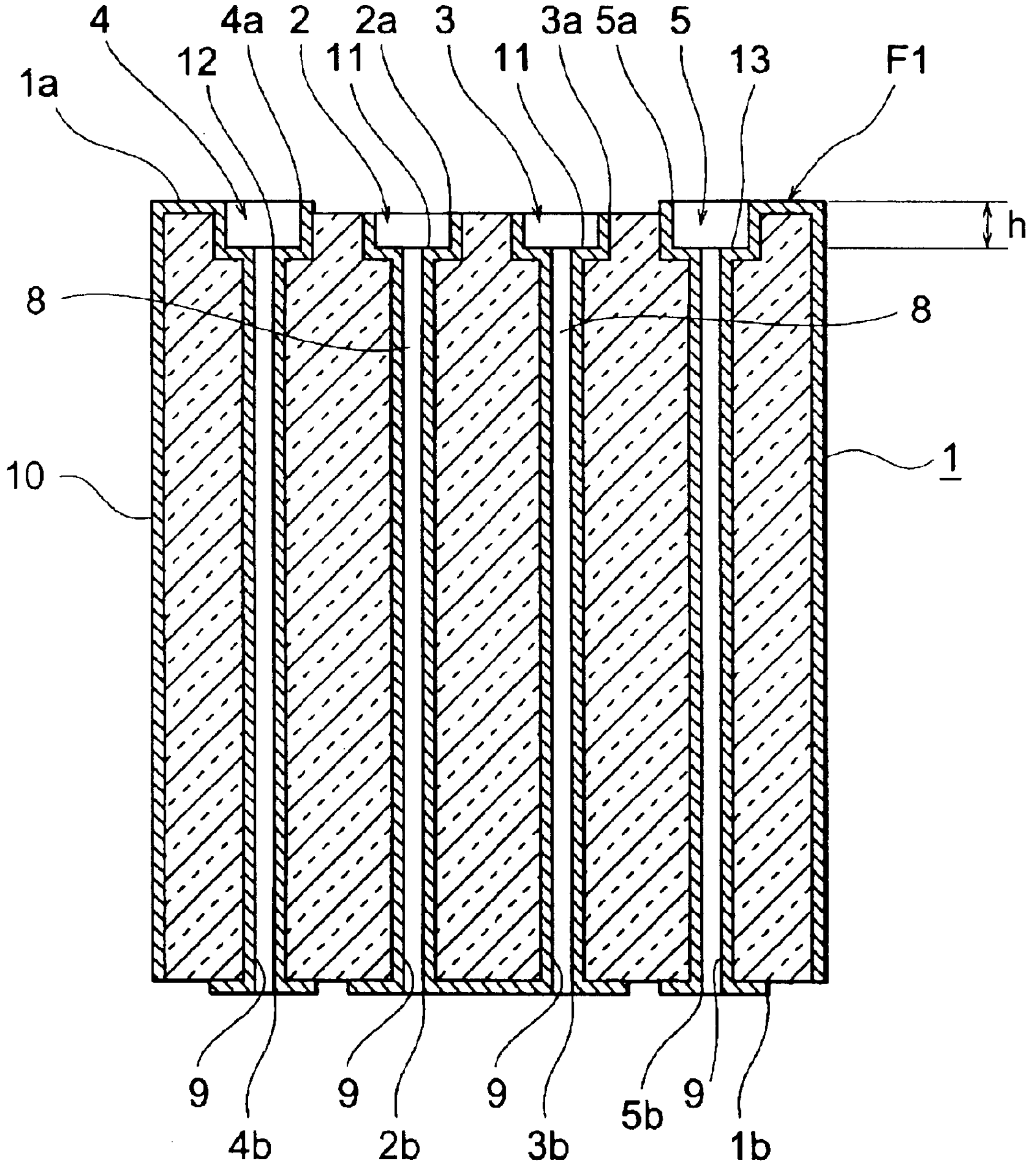
FIG. 6 is a schematic longitudinal cross section view of the dielectric filter F1 according to the first embodiment of the invention.

The dielectric ceramic block 1 is a substantially rectangularly parallelepipedic dielectric member typically made of BaO—$TiO_2$ type or BaO—$TiO_2$—$NdO_3$ type ceramic, in which the resonators 2 and 3 and the excitation holes 4 and 5 are arranged in parallel with each other. As shown in FIG. 6, the resonators 2 and 3 comprise a pair of through holes 8 bored through the dielectric ceramic block 1 at positions located close to the center of the latter. Each of the through holes 8 has an inner peripheral wall coated with an internal conductor 9. On the other hand, the excitation holes 4 and 5 are arranged outside the respective resonators 2 and 3 and their inner peripheral surfaces are coated with respective internal conductors 9.

As shown in FIG. 4, the open-circuiting ends 2*a* and 3*a* of the resonators 2 and 3 and the short-circuiting ends 4*a* and 5*a* of the excitation holes 4 and 5 are arranged on the top surface 1*a* of the dielectric ceramic block 1. As shown in FIG. 5, on the other hand, the short-circuiting ends 2*b* and 3*b* of the resonators 2 and 3 and the open-circuiting ends 4*b* and 5*b* of the excitation holes 4 and 5 are arranged on the bottom surface 1*b* of the dielectric ceramic block 1.

Furthermore, an external conductor 10 is formed on the outer peripheral surface of the dielectric ceramic block 1 over a necessary area except regions surrounding the open-circuiting ends 2*a* and 3*a* of the resonators 2 and 3 and the open-circuiting ends 4*b* and 5*b* of the excitation holes 4 and 5. The external conductor 10 has a function as shield electrode. The input/output pads 6 and 7 are formed on a lateral surface 1*c* of the dielectric ceramic block 1. The input/output pad 6 is connected to the internal conductor 9 of the excitation hole 4 at a position close to the open-circuiting end 4*b* of the excitation hole 4 and is isolated from the external conductor 10. Similarly, the input/output pad 7 is formed by extending the internal conductor 9 of the excitation hole 5 to a position close to the open-circuiting end 5*b* of the excitation hole 5 and isolated from the external conductor 10. The input/output pads 6 and 7 are electrically connected to terminals of an electrically conductive path on a printed substrate (not shown).

The open-circuiting ends 2*a* and 3*a* of the resonators 2 and 3 are provided respectively with resonator countersinks 11 having a substantially circular configuration. The internal conductors 9 applied to the inner peripheral surfaces of the through holes 8 are extended to the respective inner peripheral surfaces of the resonator countersinks 11 to enhance the extent of coupling between the resonators 2 and 3. The length of the resonators 2 and 3, or the resonance length, is made substantially equal to λ/4 of the resonance wavelength, and the resonator 2 and the excitation hole 4 are electromagnetically coupled, whereas the resonator 3 and the excitation hole 5 are electromagnetically coupled.

Now, the excitation holes 4 and 5 of this embodiment will be described below.

As shown in FIGS. 4 and 6, the short-circuiting end 4*a* of the excitation hole 4 is provided with a coupling-adjusting countersink 12 showing an increased diameter. Similarly, the short-circuiting end 5*a* of the excitation hole 5 is provided with a coupling-adjusting countersink 13 showing an increased diameter. The internal conductors 9 formed on the inner peripheral surfaces of the excitation holes 4 and 5 are extended respectively to the inner peripheral surfaces of the coupling-adjusting countersinks 12 and 13.

As a result of various experiments, the inventors of the present invention found that the input/output coupling of a dielectric filter is weakened when countersinks are formed at the short-circuiting ends 4*a* and 5*a* of the excitation holes 4 and 5. The inventors also found that the extent of input/output coupling of a dielectric filter can be changed by modifying the depth of such countersinks. Some of the results of the experiments will be summarily described below.

A specimen of dielectric filter F1 used in the experiments has following dimensions;

length: 1.8 mm, width: 5.3 mm, height: 6.44 mm, inner diameter of resonators 2 and 3: ø 0.42 mm, inner diameter of resonator countersinks 11: ø1.20 mm, inner diameter of excitation holes 4 and 5: ø0.40 mm, inner diameter of coupling-adjusting countersinks 12 and 13: ø0.7 mm. The centers of the resonators 2 and 3 are separated by a distance of 1.5 mm. The center of the resonators 2 and that of the corresponding excitation hole 4 and the center of the resonator 3 and that of the corresponding excitation hole 5 are equally separated by a distance of 1.15 mm.

Figure 2:
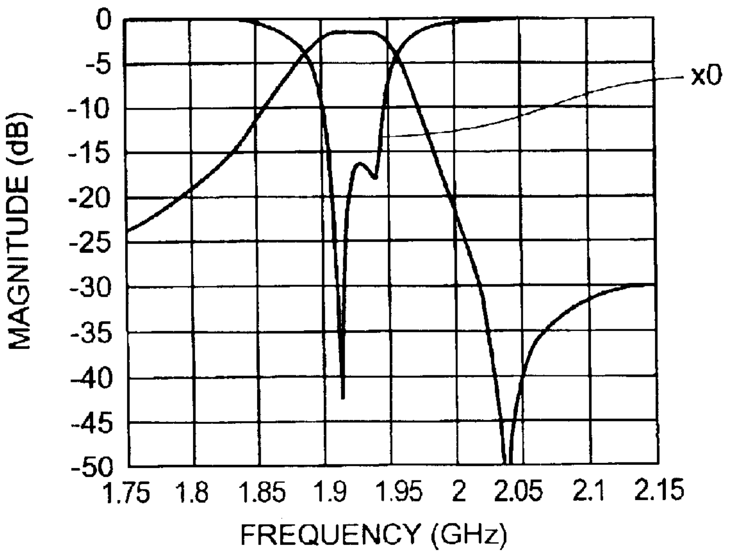
FIG. 2 (PRIOR ART)
FIG. 2 is a graph illustrating a waveform representing the reflection characteristic of the conventional dielectric filter F of FIG. 1.
Figure 7A:
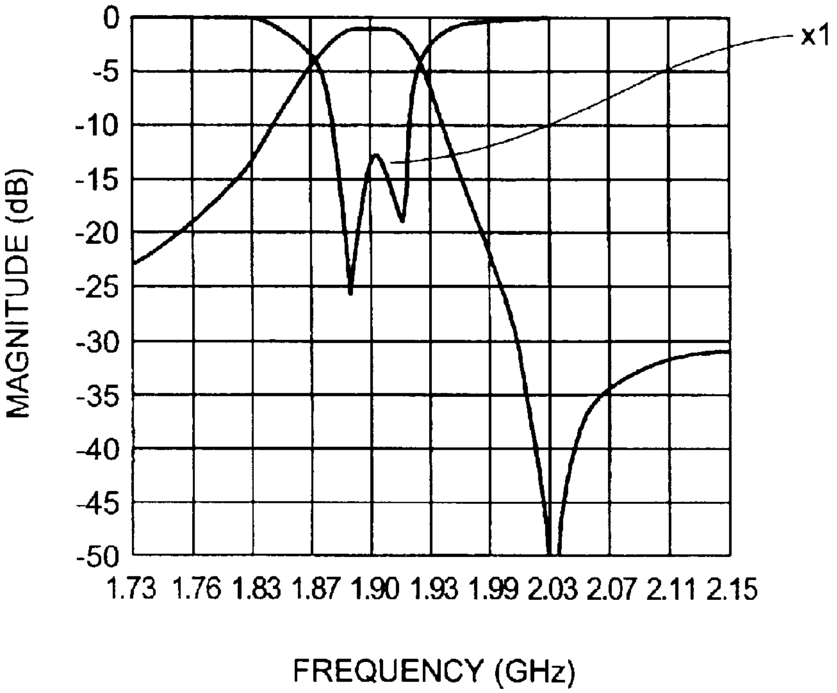
FIG. 7A is a graph illustrating a waveform representing the reflection characteristic of the dielectric filter F1 according to the first embodiment of the invention obtained when the coupling-adjusting countersinks are made 0.3 mm deep.

FIG. 7A is a graph illustrating waveform x1 representing the reflection characteristic of the first embodiment of dielectric filter F1 according to the invention obtained when the coupling-adjusting countersinks 12 and 13 arranged respectively at the short-circuiting ends 4*a* and 5*a* of the excitation holes 4 and 5 are made 0.3 mm deep. By comparing FIG. 7A and FIG. 2 which shows a graph illustrating waveform x0 representing the reflection characteristic of a known dielectric filter F in which excitation holes have no countersink, it will be seen that the input/output coupling of the first embodiment is made weaker than that of the known dielectric filter F as a result of forming coupling-adjusting countersinks 12 and 13 respectively at the short-circuiting ends 4*a* and 5*a* of the excitation holes 4 and 5.

Figure 7B:
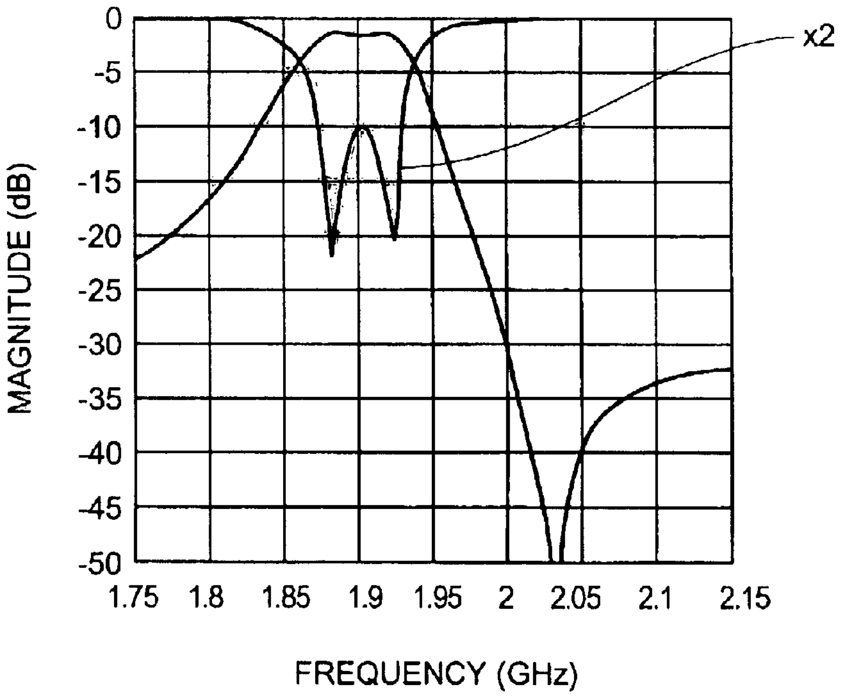
FIG. 7B is a graph illustrating a waveform representing the reflection characteristic of the dielectric filter F1 according to the first embodiment of the invention obtained when the coupling-adjusting countersinks are made 0.6 mm deep.

FIG. 7B is a graph illustrating waveform x2 representing the reflection characteristic of the first embodiment of dielectric filter F1 according to the invention obtained when the coupling-adjusting countersinks 12 and 13 arranged respectively at the short-circuiting ends 4*a* and 5*a* of the excitation holes 4 and 5 are made 0.6 mm deep. It will be seen by comparing the waveforms x2 with the waveform x1 of a dielectric filter whose coupling-adjusting countersinks 12 and 13 are made 0.3 mm deep that the input/output coupling is weakened as depth h of the coupling-adjusting countersinks 12 and 13 is increased.

Therefore, it will be clear that the input/output coupling of a dielectric filter can be weakened by forming coupling-adjusting countersinks 12 and 13 respectively at the short-circuiting ends 4*a* and 5*a* of the excitation holes 4 and 5. Furthermore, the input/output coupling can be adjusted to a desired extent by modifying the depth h of the coupling-adjusting countersinks 12 and 13.

It is also possible to adjust the extent of input/output coupling by modifying both the diameter and the profile of the coupling-adjusting countersinks 12 and 13 and thereby regulating the surface area of the internal conductors 9 of the excitation holes 4 and 5. In other words, it is possible to adjust the extent of input/output coupling by modifying the effective length of the excitation holes 4 and 5. With the above described arrangement, it is possible to obtain with ease a dielectric electronic component showing desired characteristics. Therefore, the present invention provides a remarkably advantage of being able to meet the demand for a wide variety of characteristics.

Figure 8:
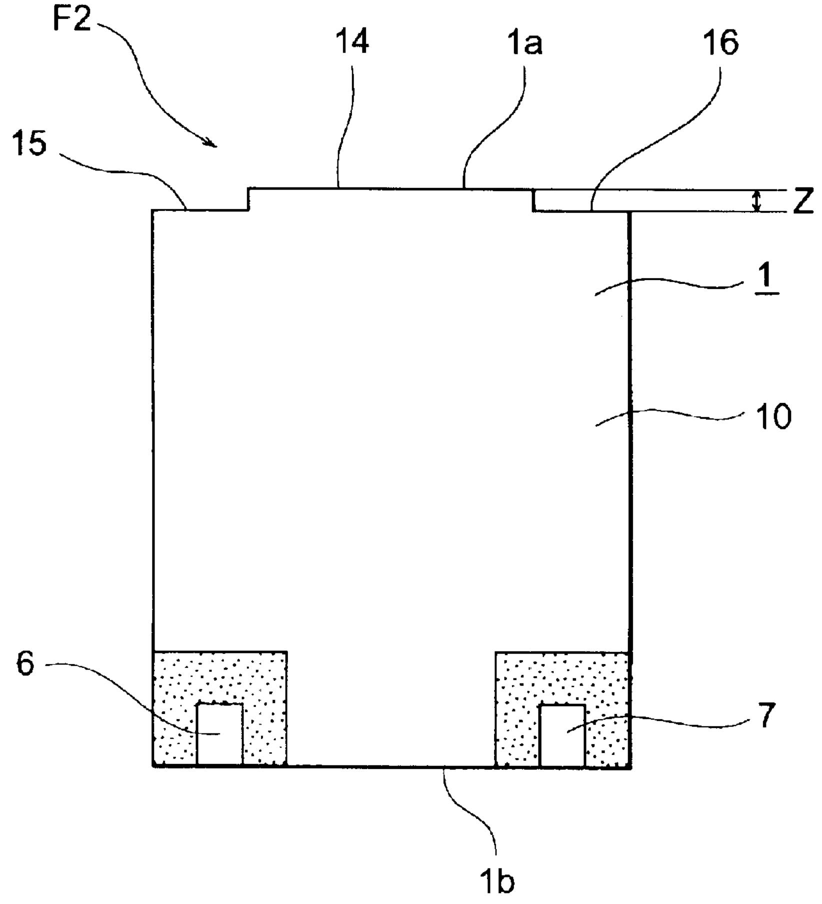
FIG. 8 is a schematic front view showing the second embodiment of a dielectric filter F2 according to the invention.
Figure 9:
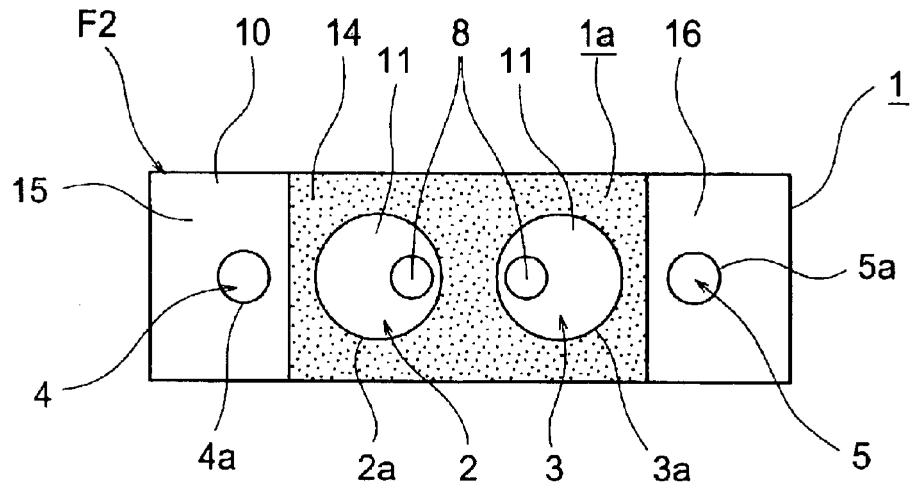
FIG. 9 is a schematic top view of the dielectric filter F2 according to the second embodiment of the invention.
Figure 10:
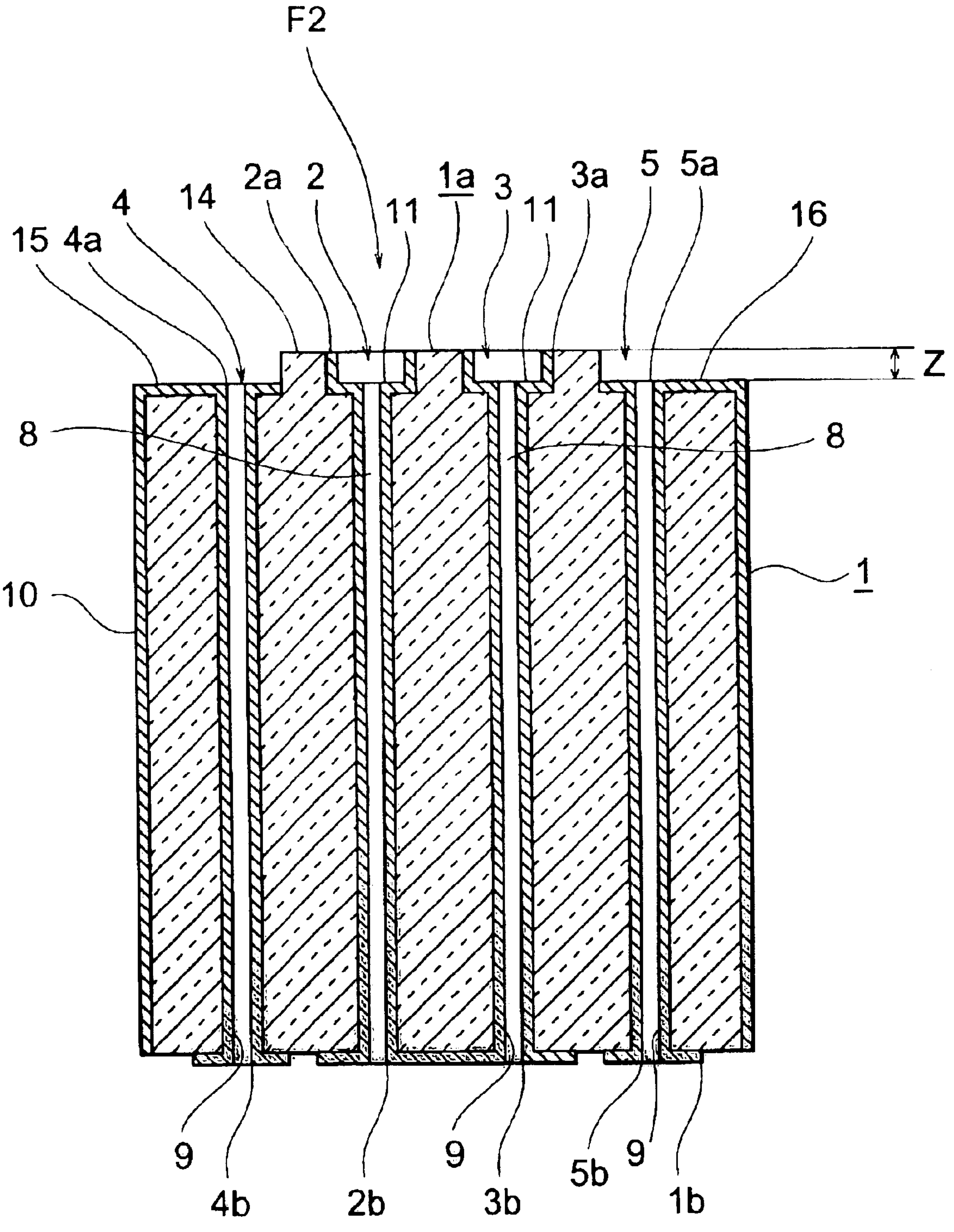
FIG. 10 is a schematic longitudinal cross section view of the dielectric filter F2 according to the second embodiment of the invention.

FIGS. 8 through 10 illustrate a dielectric filter F2 according to the second embodiment of the present invention. In FIGS. 8, 9 and 10, the components that are same as those of the first embodiment of dielectric filter F1 are denoted respectively by the same reference symbol and will not be described any further.

The dielectric filter F2 comprises a dielectric ceramic block 1 whose top surface 1*a* defines an open-circuiting end facet 14 and coupling-adjusting setback facets 15 and 16. More specifically, as shown in FIGS. 8 and 9, the open-circuiting ends 2*a* and 3*a* of the resonators 2 and 3 are arranged on the open-circuiting end facet 14. The coupling-adjusting setback facets 15 and 16 are recessed by a predetermined distance of z from the open-circuiting end facet 14. The short-circuiting end 4*a* of the excitation hole 4 is arranged on the coupling-adjusting setback facet 15, whereas the short-circuiting end 5*a* of the excitation hole 5 is arranged on the coupling-adjusting setback facet 16.

As shown in FIG. 10, the coupling-adjusting setback facets 15 and 16 are coated with an external conductor 10 and connected to the internal conductors 9 formed respectively on the inner peripheral surfaces of the excitation holes 4 and 5.

As a result of various experiments, the inventors of the present invention found that the input/output coupling of a dielectric filter is weakened when coupling-adjusting setback facets 15 and 16 are formed at the short-circuiting ends 4*a* and 5*a* of the excitation holes 4 and 5. The inventors also found that the extent of input/output coupling of a dielectric filter F2 can be changed by modifying the distance z by which the setback facets 15 and 16 are recessed from the open end facet 14. Some of the results of the experiments will be summarily described below.

A specimen of dielectric filter F2 used in the experiments has dimensions same as the specimen described above by referring to the first embodiment.

Figure 1:
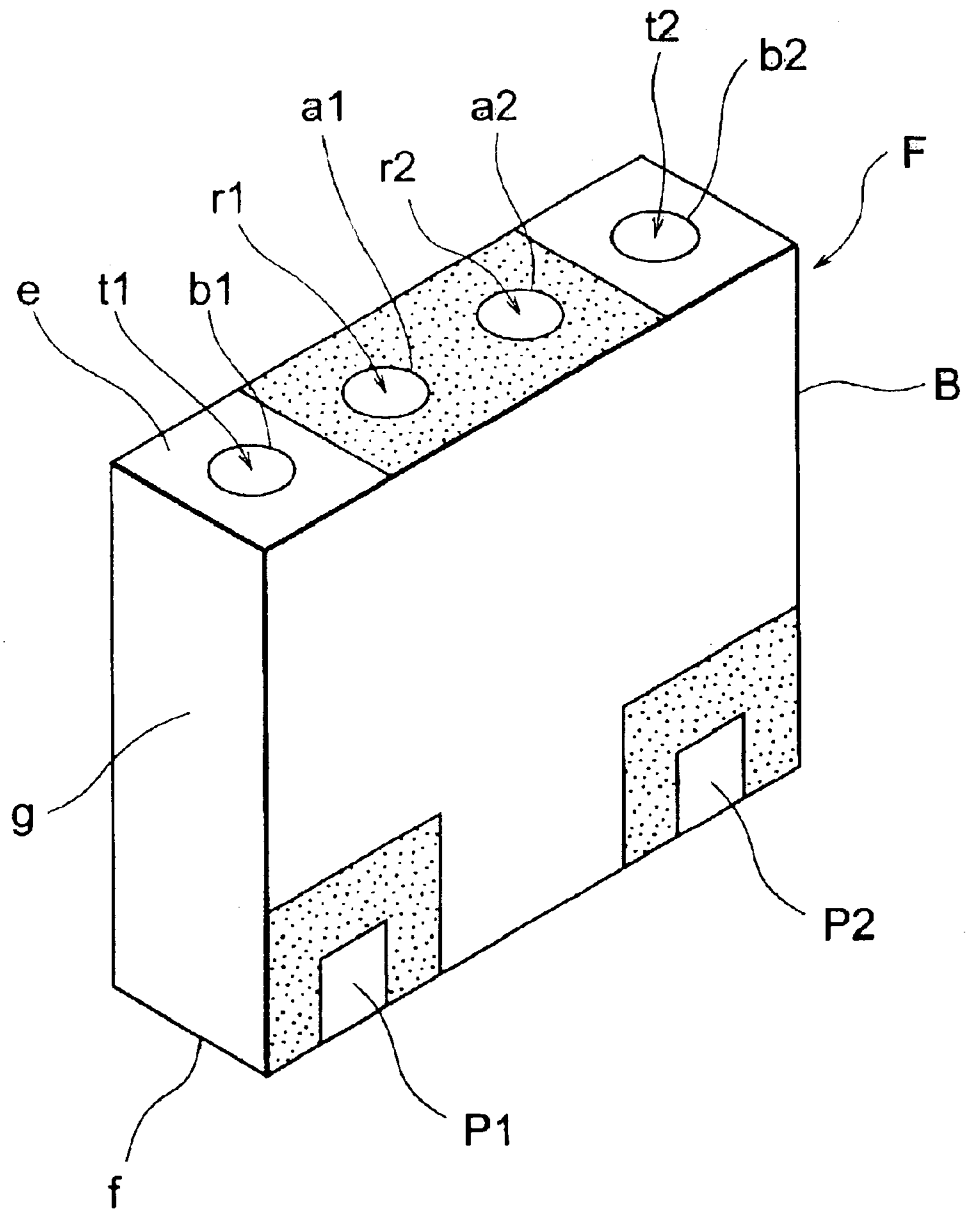
FIG. 1 (PRIOR ART)
FIG. 1 is a schematic perspective view showing a conventional dielectric filter F.
Figure 11A:
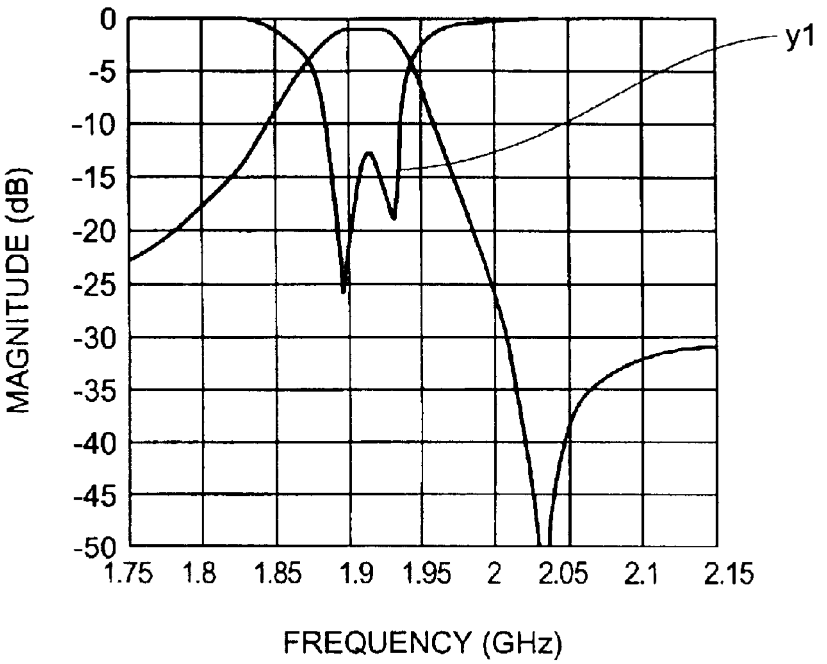
FIG. 11A is a graph illustrating a waveform representing the reflection characteristic of the dielectric filter F2 according to the second embodiment of the invention obtained when the coupling-adjusting setback facets are made to be a 0.1 mm deep recess.

FIG. 11A is a graph illustrating waveform y1 representing the reflection characteristic of the dielectric filter F2 according to the second embodiment of the present invention. This waveform y1 is obtained when the coupling-adjusting setback facets 15 and 16 arranged respectively at the short-circuiting ends 4*a* and 5*a* of the excitation holes 4 and 5 are recessed from the open-circuiting end facet 14 by distance z which is equal to 0.1 mm. By the provision of the coupling-adjusting setback facets 15 and 16 it will be seen that the input/output coupling of the embodiment is weakened if compared with a conventional dielectric filter F shown in FIG. 1. The conventional dielectric filter F has no setback facets on the dielectric ceramic block and has a reflection characteristic represented by the waveform x0 of FIG. 2.

Figure 11B:
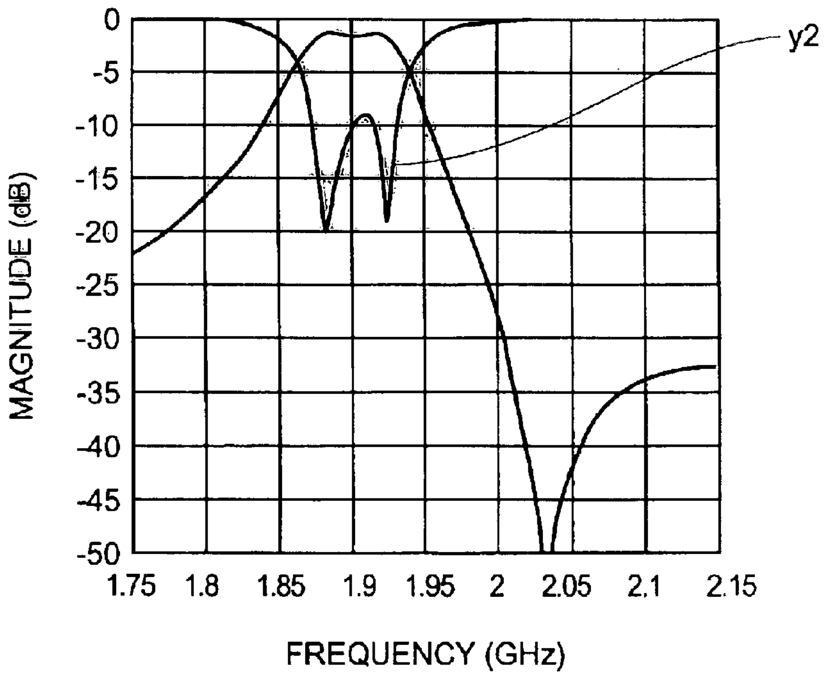
FIG. 11B is a graph illustrating a waveform representing the reflection characteristic of the dielectric filter F2 according to the second embodiment of the invention obtained when the coupling-adjusting setback facets are made to be a 0.2 mm deep recess.
Figure 12:
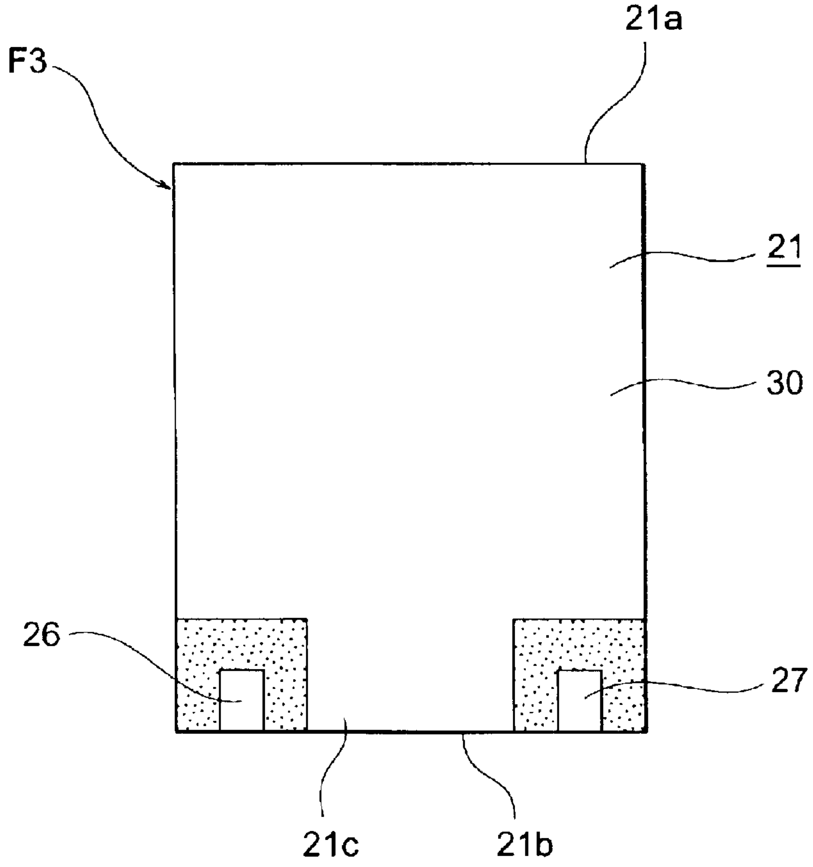
FIG. 12 is a schematic front view showing the third embodiment of a dielectric filter F3 according to the invention.

FIG. 11B is a graph illustrating waveform y2 representing the reflection characteristic of the second embodiment of dielectric filter F2. The waveform y2 is obtained when the coupling-adjusting setback facets 15 and 16 arranged respectively at the short-circuiting ends 4*a* and 5*a* of the excitation holes 4 and 5 are recessed from the open-circuiting end facet 14 by distance z which is equal to 0.2 mm. It will be seen by comparing it with the graph for distance z which is equal to 0.1 mm (FIG. 11A) that the input/output coupling is weakened as the distance z is increased.

Therefore, it will be clear that the input/output coupling of a dielectric filter can be weakened by arranging an open-circuiting end facet 14 and recessed coupling-adjusting setback facets 15 and 16 on the top surface 1*a* of the dielectric ceramic block 1. Furthermore, the input/output coupling can be adjusted to a desired extent by modifying the distance z by which the coupling-adjusting countersinks 15 and 16 are recessed from the open-circuiting end facet 14.

It is also possible to adjust the extent of input/output coupling by modifying both the area of the coupling-adjusting setback facets 15 and 16. In other words, it is possible to adjust the extent of input/output coupling by modifying the effective length of the excitation holes 4 and 5. With the above described arrangement, it is possible to obtain with ease a dielectric electronic component showing desired characteristics. Therefore, the present invention provides a remarkably advantage of being able to meet the demand for a wide variety of characteristics.

FIGS. 12 through 15 illustrate a dielectric filter F3 according to the third embodiment of the present invention.

The illustrated dielectric filter F3 comprises a dielectric ceramic block 21, a pair of resonators 22 and 23, a pair of excitation holes 24 and 25 and a pair of input/output pads 26 and 27.

Figure 15:
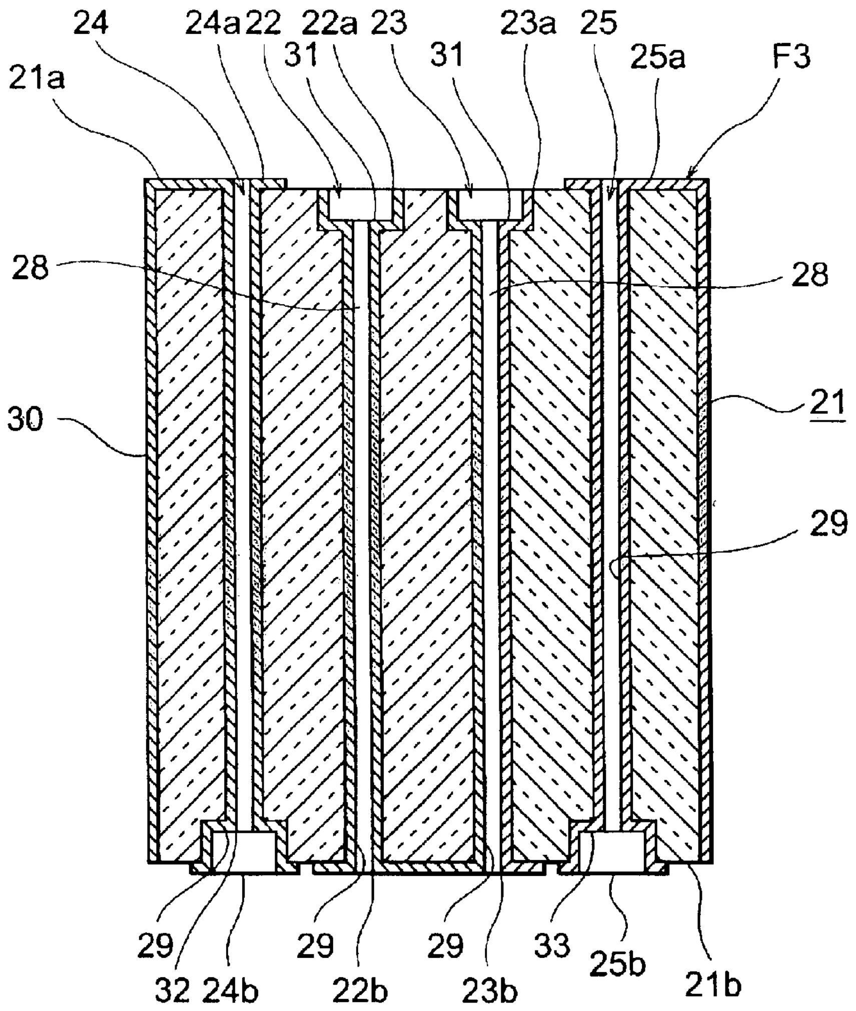
FIG. 15 is a schematic longitudinal cross section view of the dielectric filter F3 according to the third embodiment of the invention.

The dielectric ceramic block 21 is a substantially rectangularly parallelepipedic dielectric member typically made of BaO—$TiO_2$ type or BaO—$TiO_2$—$NdO_3$ type ceramic, in which the resonators 22 and 23 and the excitation holes 24 and 25 are arranged in parallel with each other. As shown in FIG. 15, the resonators 22 and 23 comprise a pair of through holes 28 bored through the dielectric ceramic block 21 at positions located close to the center of the latter. Each of the through holes 28 has an inner peripheral wall coated with an internal conductor 29. On the other hand, the excitation holes 24 and 25 are arranged outside the respective resonators 22 and 23 and their inner peripheral surfaces are coated with respective internal conductors 29.

Figure 13:
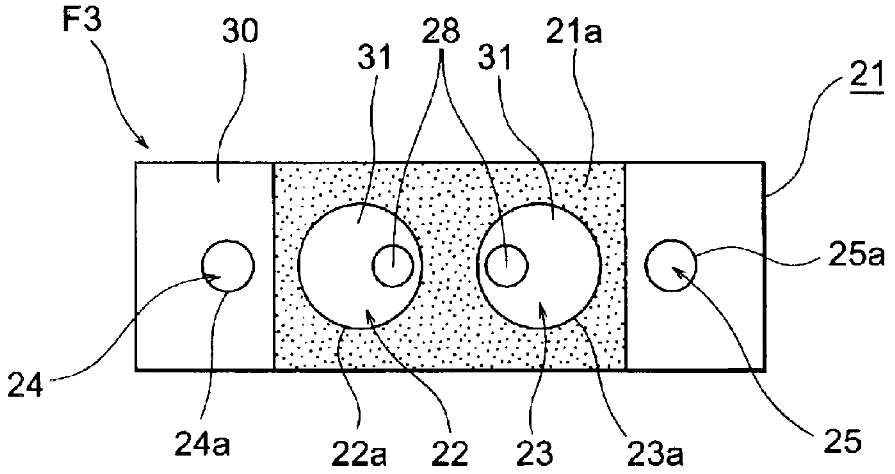
FIG. 13 is a schematic top view of the dielectric filter F3 according to the third embodiment of the invention.
Figure 14:
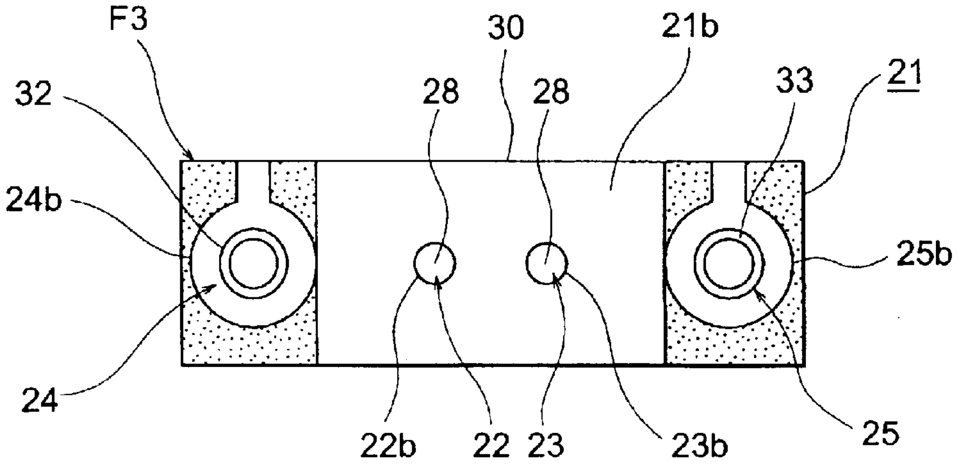
FIG. 14 is a schematic bottom view of the dielectric filter F3 according to the third embodiment of the invention.

As shown in FIG. 13, the open-circuiting ends 22*a* and 23*a* of the resonators 22 and 23 and the short-circuiting ends 24*a* and 25*a* of the excitation holes 24 and 25 are arranged on the top surface 21*a* of the dielectric ceramic block 21. As shown in FIG. 14, the short-circuiting ends 22*b* and 23*b* of the resonators 22 and 23 and the open-circuiting ends 24*b* and 25*b* of the excitation holes 24 and 25 are arranged on the bottom surface 21*b* of the dielectric ceramic block 21.

Furthermore, an external conductor 30 is formed on the outer peripheral surface of the dielectric ceramic block 21 except regions surrounding the open-circuiting ends 22*a* and 23*a* of the resonators 22 and 23 and the open-circuiting ends 24*b* and 25*b* of the excitation holes 24 and 25. The external conductor 30 has a function as shield electrode. The input/output pads 26 and 27 are formed on a lateral surface 21*c* of the dielectric ceramic block 21. The input/output pad 26 is connected to the internal conductor 29 of the excitation hole 24 at a position close to the open-circuiting end 24*b* of the excitation hole 24 and is isolated from the external conductor 30. Similarly, the input/output pad 27 is formed by extending the internal conductor 29 of the excitation hole 25 to a position close to the open-circuiting end 25*b* of the excitation hole 25 and isolated from the external conductor 30. The input/output pads 26 and 27 are electrically connected to terminals of an electrically conductive path on a printed substrate (not shown).

The open-circuiting ends 22*a* and 23*a* of the resonators 22 and 23 are provided respectively with resonator countersinks 31 having a substantially circular configuration. The internal conductors 29 applied to the inner peripheral surfaces of the through holes 28 are extended to the respective inner peripheral surfaces of the resonator countersinks 31 to enhance the extent of coupling between the resonators 22 and 23. The length of the resonators 22 and 23, or the resonance length, is made substantially equal to λ/4 of the resonance wavelength, and the resonator 22 and the excitation hole 24 are electromagnetically coupled, whereas the resonator 23 and the excitation hole 25 are electromagnetically coupled.

Now, the excitation holes 24 and 25 of the second embodiment will be described below.

As shown in FIGS. 14 and 15, the open-circuiting end 24*b* of the excitation hole 24 is provided with a coupling-adjusting countersink 32 having an increased diameter. Similarly, the open-circuiting end 25*b* of the excitation hole 25 is provided with a coupling-adjusting countersink 33 having an increased diameter. The internal conductors 29 formed on the inner peripheral surfaces of the excitation holes 24 and 25 are extended respectively to the inner peripheral surfaces of the coupling-adjusting countersinks 32 and 33.

As a result of various experiments, the inventors of the present invention found that the input/output coupling of a dielectric filter is strengthened when countersinks are formed at the open-circuiting ends 24*b* and 25*b* of the excitation holes 24 and 25. The inventors also found that the extent of input/output coupling of a dielectric filter can be changed by modifying the depth of such countersinks. Some of the results of the experiments will be summarily described below.

A specimen of dielectric filter F3 used in the experiments has following dimensions;

length: 1.8 mm, width: 5.3 mm, height: 6.44 mm, inner diameter of resonators 22 and 23: ø0.42 mm, inner diameter of resonator countersinks 31: ø 1.20 mm, inner diameter of excitation holes 24 and 25: ø0.40 mm, inner diameter of coupling-adjusting countersinks 32 and 33: ø0.7 mm. The centers of the resonators 32 and 33 are separated by a distance of 1.5 mm. The center of the resonators 22 and that of the corresponding excitation hole 24 and the center of the resonator 23 and that of the corresponding excitation hole 25 are equally separated by a distance of 1.15 mm.

Figure 16A:
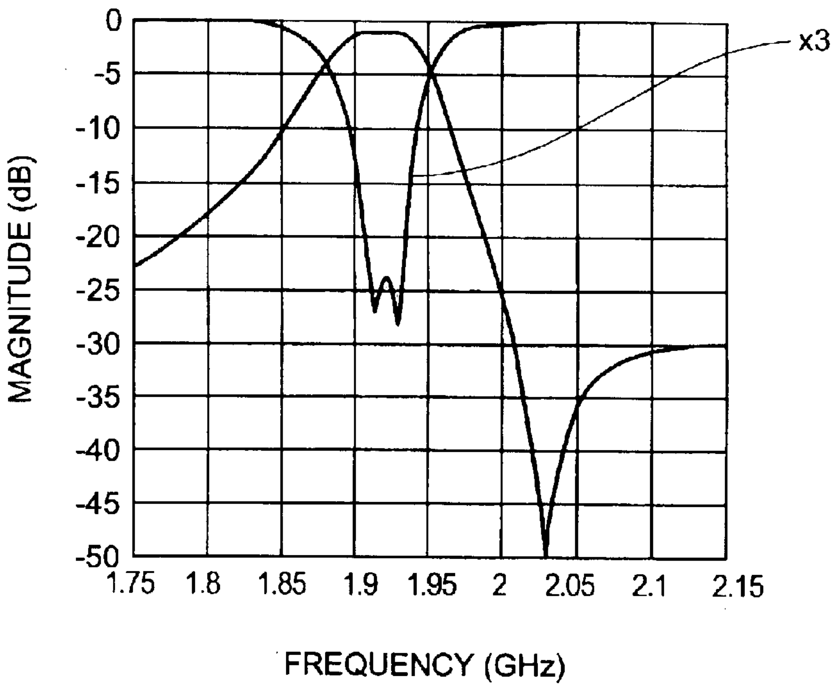
FIG. 16A is a graph illustrating a waveform representing the reflection characteristic of the dielectric filter F3 according to the third embodiment of the invention obtained when the coupling-adjusting countersinks are made 0.3 mm deep.

FIG. 16A is a graph illustrating waveform x3 representing the reflection characteristic of the third embodiment of dielectric filter F3 according to the invention obtained when the coupling-adjusting countersinks 32 and 33 arranged respectively at the open-circuiting ends 24*b* and 25*b* of the excitation holes 24 and 25 are made 0.1 mm deep. By comparing FIG. 16A and FIG. 2 which shows a graph illustrating waveform x0 representing the reflection characteristic of a known dielectric filter F in which excitation holes have no countersink, it will be seen that the input/output coupling of the second embodiment is made strengthened than that of the known dielectric filter F as a result of forming coupling-adjusting countersinks 32 and 33 respectively at the short-circuiting ends 24*a* and 25*a* of the excitation holes 24 and 25.

Figure 16B:
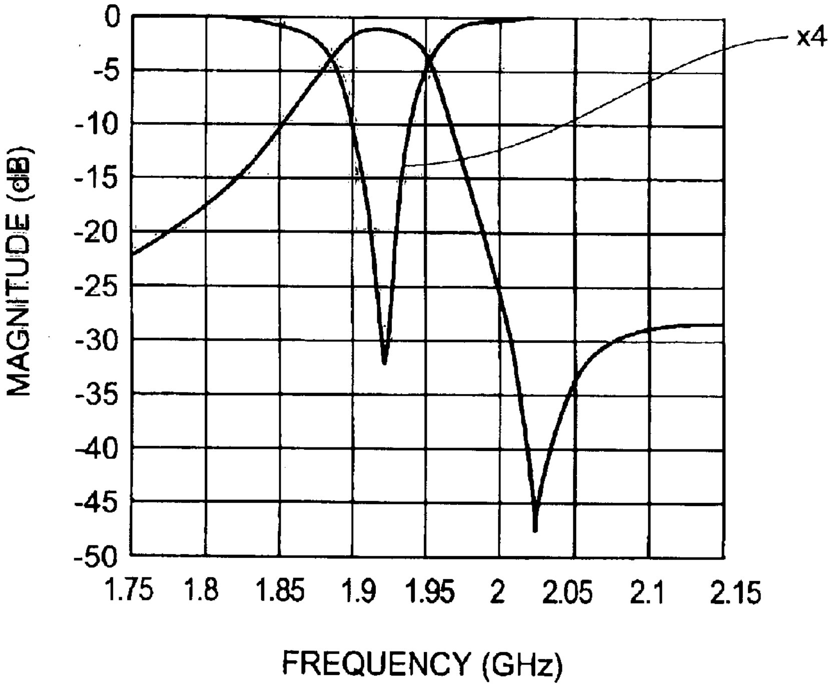
FIG. 16B is a graph illustrating a waveform representing the reflection characteristic of the dielectric filter F3 according to the third embodiment of the invention obtained when the coupling-adjusting countersinks are made 0.6 mm deep.

FIG. 16B is a graph illustrating waveform x4 representing the reflection characteristic of the third embodiment of dielectric filter F3 according to the invention obtained when the coupling-adjusting countersinks 32 and 33 arranged respectively at the short-circuiting ends 24*a* and 25*a* of the excitation holes 24 and 25 are made 0.2 mm deep. It will be seen by comparing the waveforms x4 with the waveform x3 of a dielectric filter whose coupling-adjusting countersinks 32 and 33 are made 0.1 mm deep that the input/output coupling is strengthened as depth h of the coupling-adjusting countersinks 32 and 33 is increased.

Therefore, it will be clear that the input/output coupling of a dielectric filter can be strengthened by forming coupling-adjusting countersinks 32 and 33 respectively at the short-circuiting ends 24*a* and 25*a* of the excitation holes 24 and 25. Furthermore, the input/output coupling can be adjusted to a desired extent by modifying the depth h of the coupling-adjusting countersinks 32 and 33.

It is also possible to adjust the extent of input/output coupling by modifying both the diameter and the profile of the coupling-adjusting countersinks 32 and 33 and thereby regulating the surface area of the internal conductors 29 of the excitation holes 24 and 25. In other words, it is possible to adjust the extent of input/output coupling by modifying the effective length of the excitation holes 24 and 25. With the above described arrangement, it is possible to obtain with ease a dielectric electronic component showing desired characteristics. Therefore, the present invention provides a remarkably advantage of being able to meet the demand for a wide variety of characteristics.

Figure 17:
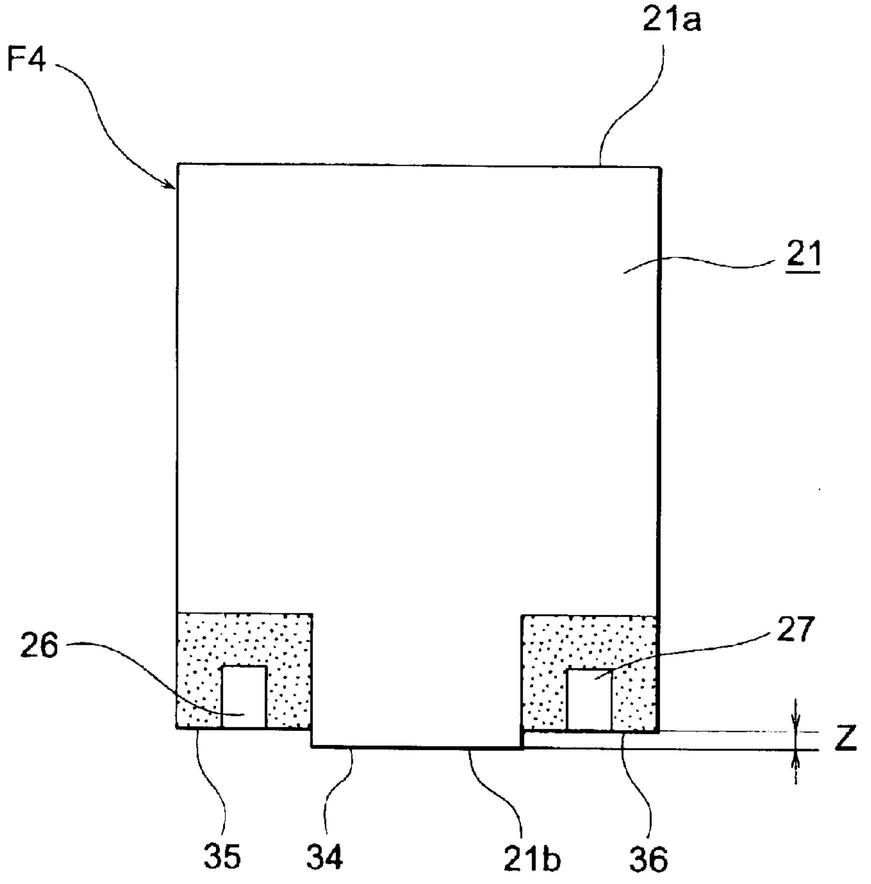
FIG. 17 is a schematic front view showing a dielectric filter F4 according to the fourth embodiment of the invention.
Figure 18:
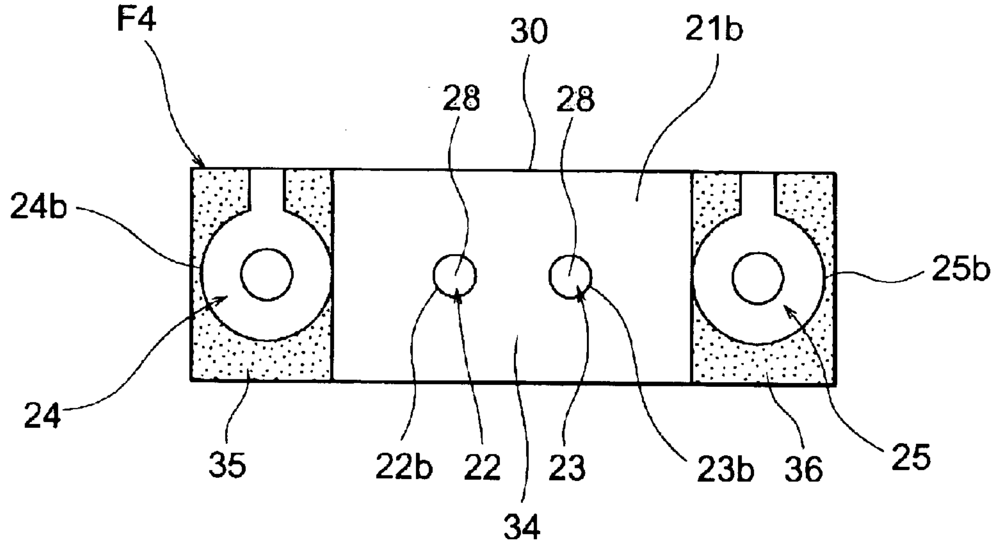
FIG. 18 is a schematic bottom view of the dielectric filter F4 according to the fourth embodiment of the invention.
Figure 19:
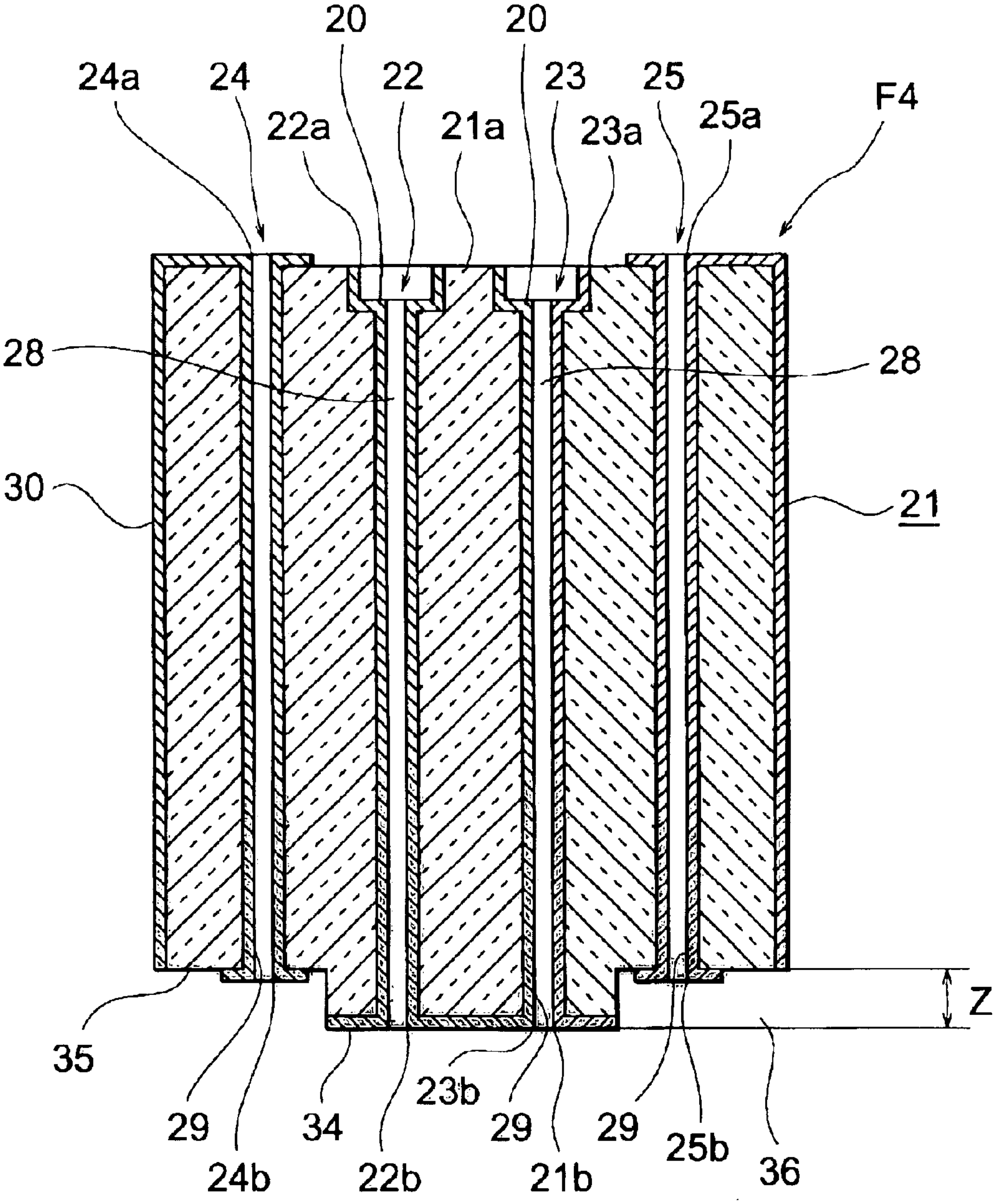
FIG. 19 is a schematic longitudinal cross section view of the dielectric filter F4 according to the fourth embodiment of the invention.

FIGS. 17 through 19 illustrate a dielectric filter F4 according to the fourth embodiment of the present invention. In FIGS. 17, 18 and 19, the components that are same as those of the third embodiment of dielectric filter F3 are denoted respectively by the same reference symbol and will not be described any further.

The illustrated dielectric filter F4 comprises a dielectric ceramic block 21 whose top surface 21*b* defines a short-circuiting end facet 34 and coupling-adjusting setback facets 35 and 36. More specifically, as shown in FIGS. 17 and 18, the short-circuiting ends 22*b* and 23*b* of the resonators 22 and 23 are arranged on the short-circuiting end facet 34. The coupling-adjusting setback facets 35 and 36 are recessed by a predetermined distance of z from the short-circuiting end facet 34. The open-circuiting end 24*b* of the excitation hole 24 is arranged on the coupling-adjusting setback facet 35, whereas the open-circuiting end 25*b* of the excitation hole 25 is arranged on the coupling-adjusting setback facet 36.

As shown in FIGS. 18 and 19, the coupling-adjusting setback facets 35 and 36 are not coated with an external conductor 30. The internal conductors 29 formed on the inner peripheral surfaces of the excitation holes 24 and 25 are extended to the input/output pads 26 and 27.

As a result of various experiments, the inventors of the present invention found that the input/output coupling of a dielectric filter is strengthened when coupling-adjusting setback facets 35 and 36 are formed at the open-circuiting ends 24*b* and 25*b* of the excitation holes 24 and 25. The inventors also found that the extent of input/output coupling of a dielectric filter F4 can be changed by modifying the distance z by which the setback facets 35 and 36 are recessed from the short-circuiting end facet 34. Some of the results of the experiments will be summarily described below.

A specimen of dielectric filter F4 used in the experiments has dimensions same as the specimen described above by referring to the third embodiment.

Figure 20A:
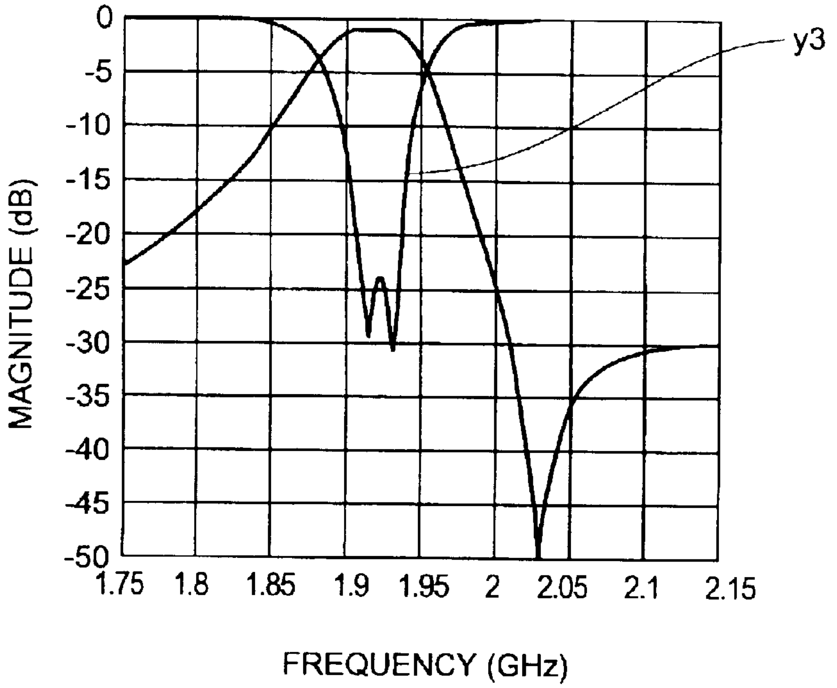
FIG. 20A is a graph illustrating a waveform representing the reflection characteristic of the dielectric filter F4 according to the fourth embodiment of the invention obtained when the coupling-adjusting setback facets are made to be a 0.1 mm deep recess.

FIG. 20A is a graph illustrating waveform y3 representing the reflection characteristic of the dielectric filter F4 according to the fourth embodiment of the present invention when the distance z is set to 0.1 mm. This waveform y3 is obtained when the coupling-adjusting setback facets 35 and 36 arranged respectively at the open-circuiting ends 24*b* and 25*b* of the excitation holes 24 and 25 are recessed from the short-circuiting end facet 34 by distance z which is equal to 0.1 mm. By the provision of the coupling-adjusting setback facets 35 and 36 it will be seen that the input/output coupling of the embodiment is strengthened if compared with a conventional dielectric filter F shown in FIG. 1.

Figure 20B:
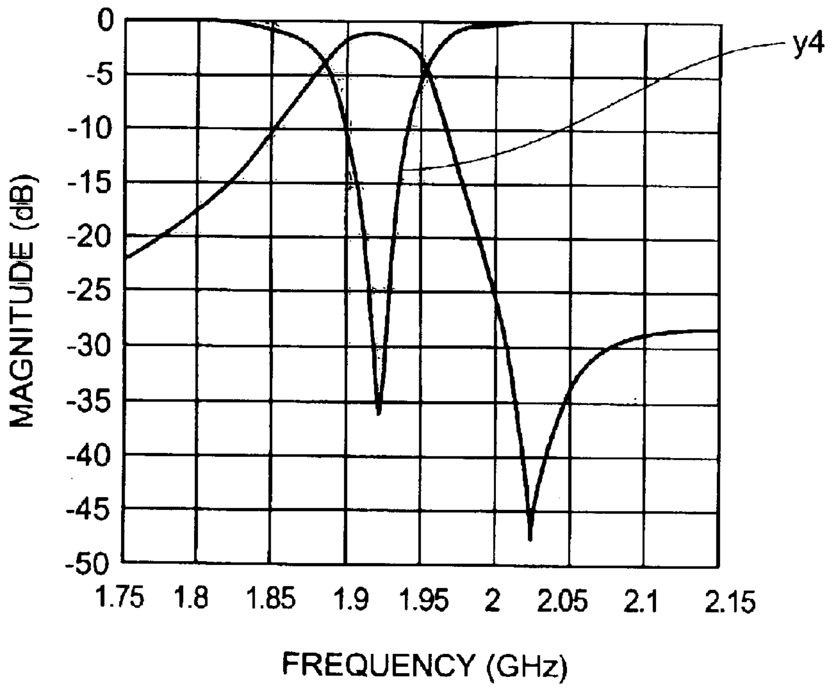
FIG. 20B is a graph illustrating a waveform representing the reflection characteristic of the dielectric filter F4 according to the fourth embodiment of the invention obtained when the coupling-adjusting setback facets are made to be a 0.2 mm deep recess.

FIG. 20B is a graph illustrating a waveform y4 representing the reflection characteristic of the fourth embodiment of dielectric filter F4 when the distance z is set to 0.2 mm. That is, the waveform y4 is obtained when the coupling-adjusting setback facets 35 and 36 arranged respectively at the open-circuiting ends 24*b* and 25*b* of the excitation holes 24 and 25 are recessed from the short-circuiting end facet 34 by distance z which is equal to 0.2 mm. It will be seen by comparing it with the graph for distance z which is equal to 0.1 mm (FIG. 20A) that the input/output coupling is strengthened as the distance z is increased.

Therefore, it will be clear that the input/output coupling of a dielectric filter can be strengthened by arranging an short-circuiting end facet 34 and recessed coupling-adjusting setback facets 35 and 36 on the bottom surface 21*b* of the dielectric ceramic block 21. Furthermore, the input/output coupling can be adjusted to a desired extent by modifying the distance z by which the coupling-adjusting countersinks 35 and 36 are recessed from the short-circuiting end facet 34.

It is also possible to adjust the extent of input/output coupling by modifying both the area of the coupling-adjusting setback facets 35 and 36. In other words, it is possible to adjust the extent of input/output coupling by modifying the effective length of the excitation holes 24 and 25. With the above-described arrangement, it is possible to obtain with ease a dielectric electronic component showing desired characteristics. Therefore, the present invention provides a remarkably advantage of being able to meet the demand for a wide variety of characteristics.

Referring to FIGS. 21 through 24, there is illustrated a dielectric filter F5 according to the fifth embodiment of the invention. The illustrated dielectric filter F5 comprises a dielectric ceramic block 41, a pair of resonators 42 and 43, a pair of excitation holes 44 and 45 and a pair of input/output pads 46 and 47.

Figure 22:
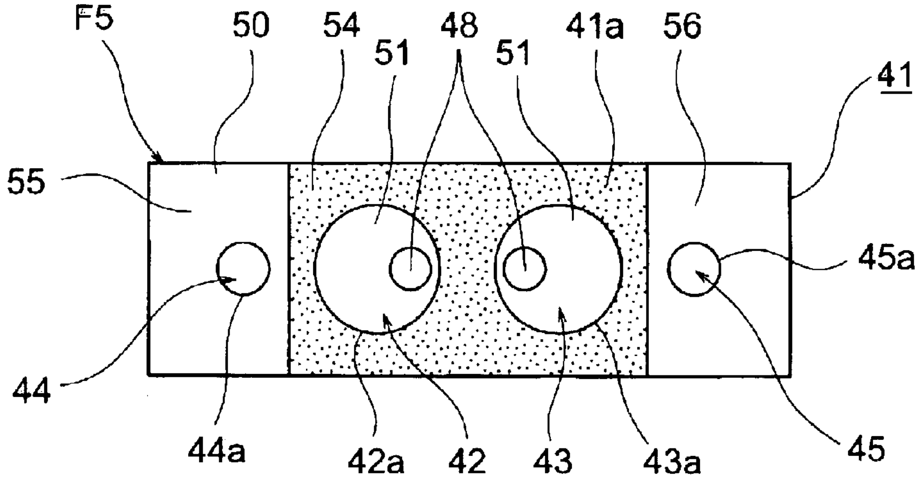
FIG. 22 is a schematic top view of the dielectric filter F5 of FIG. 21.
Figure 23:
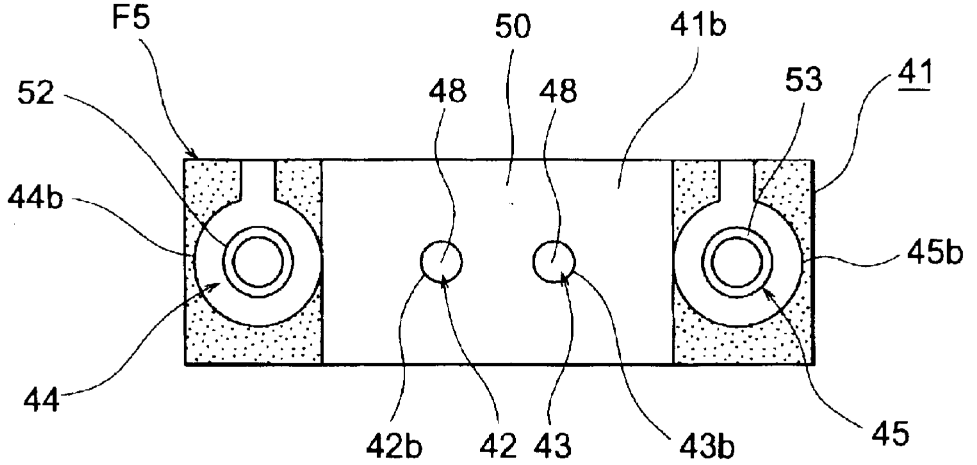
FIG. 23 is a schematic bottom view of the dielectric filter F5 of FIG. 21.
Figure 24:
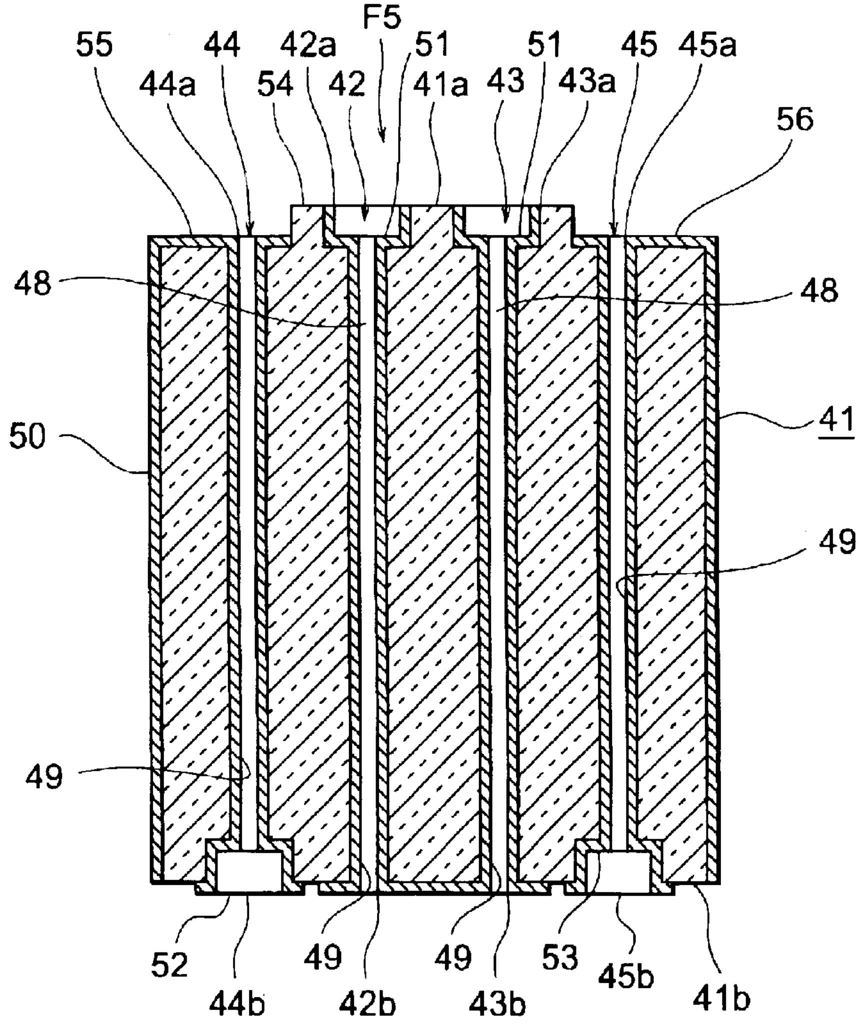
FIG. 24 is a schematic longitudinal cross section view of the dielectric filter F5 of FIG. 21.

The dielectric ceramic block 41 is a substantially rectangularly parallelepipedic dielectric member typically made of BaO—$TiO_2$ type or BaO—$TiO_2$—$NdO_3$ type ceramic, in which the resonators 42 and 43 and the excitation holes 44 and 45 are arranged in parallel with each other. As shown in FIGS. 22 and 23, the resonators 42 and 43 include a pair of through holes 48 provided through the dielectric ceramic block 41 at positions located close to the center of the latter. On the other hand, the excitation holes 44 and 45 comprise a pair of through holes provided at positions located outside the respective resonators 42 and 43. As shown in FIG. 24, the resonators 42 and 43 are formed by coating the inner peripheral surfaces of the through holes 48 with an internal conductor 49. Similarly, the excitation holes 44 and 45 are formed by coating the inner peripheral surfaces of the through holes with an internal conductor 49.

As shown in FIG. 22, the open-circuiting ends 42*a* and 43*a* of the resonators 42 and 43 and the short-circuiting ends 44*a* and 45*a* of the excitation holes 44 and 45 are arranged on the top surface 41*a* of the dielectric ceramic block 41. As shown in FIG. 23, on the other hand, the short-circuiting ends 42*b* and 43*b* of the resonators 42 and 43 and the open-circuiting ends 44*b* and 45*b* of the excitation holes 44 and 45 are arranged on the bottom surface 41*b* of the dielectric ceramic block 41.

Additionally, an external conductor 50 is formed on the outer peripheral surface of the dielectric ceramic block 41 except regions surrounding the open-circuiting ends 42*a* and 43*a* of the resonators 42 and 43 and the open-circuiting ends 44*b* and 45*b* of the excitation holes 44 and 45 so as to operate as shield electrode. Input/output pads 46 and 47 are formed on a lateral surface of the dielectric ceramic block 41 (see FIG. 21). The input/output pad 46 is formed by extending the internal conductor 49 of the excitation hole 44 to a position close to the open-circuiting end 44*b* of the excitation hole 44 and isolated from the external conductor 50. Similarly, the input/output pad 47 is formed by extending the internal conductor 49 of the excitation hole 45 to a position close to the open-circuiting end 45*b* of the excitation hole 45 and isolated from the external conductor 50. The input/output pads 46 and 47 are electrically connected to terminals of an electrically conductive path on a printed substrate (not shown).

The open-circuiting ends 42*a* and 43*a* of the resonators 42 and 43 are provided respectively with resonator countersinks 51 showing a substantially circular plan view. The internal conductors 49 applied to the inner peripheral surfaces of the through holes 48 are extended to the respective inner peripheral surfaces of the resonator countersinks 51 to enhance the extent of coupling between the resonators 42 and 43. The length of the resonators 42 and 43, or the resonance length, is made substantially equal to $\lambda/4$ of the resonance wavelength and the resonator 42. The resonator 42 and the excitation hole 44 are electromagnetically coupled. The resonator 43 and the excitation hole 45 are electromagnetically coupled.

Now, a principal component of the fifth embodiment will be described below.

Figure 21:
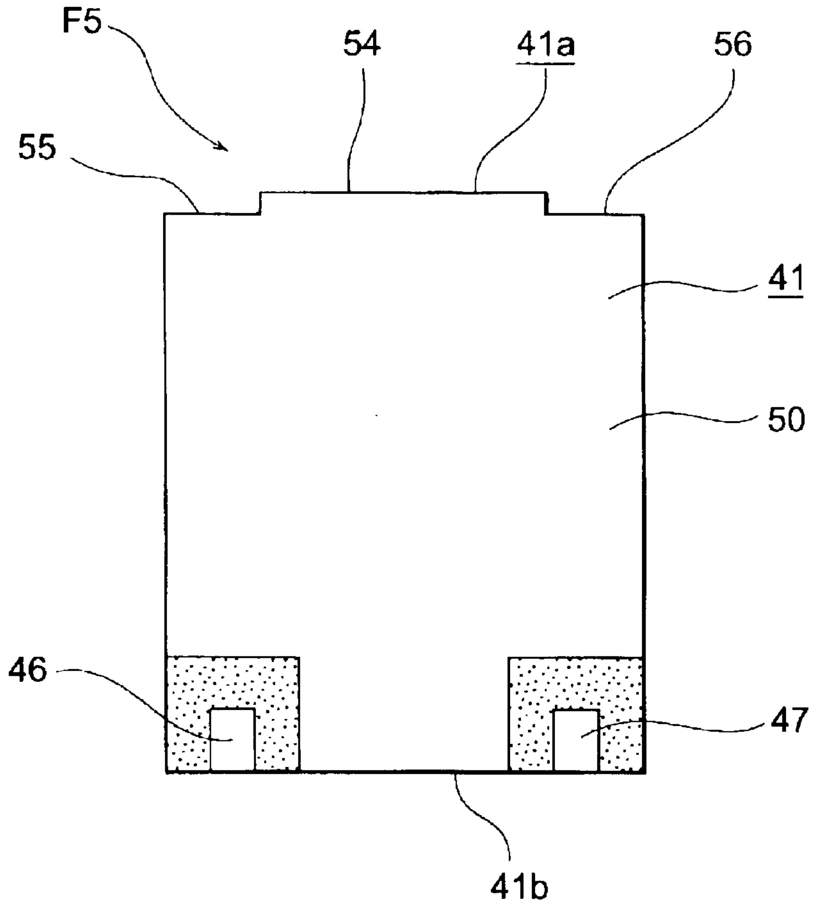
FIG. 21 is a schematic front view showing a dielectric filter F5 according to the fifth invention.

As shown in FIGS. 21 and 24, the top surface 41*a* of the dielectric ceramic block 41 is provided with an open-circuiting end facet 54 and two setback facets 55, 56. On the open-circuiting end facet 54 the open ends 42*a* and 43*a* of the resonators 42 and 43 are arranged. One of the setback facet 55 is coated with a conductor, in which the short-circuiting end 44*a* of the excitation hole 44 is arranged. The other setback facet 56 is also coated with a conductor, in which the short-circuiting end 45*a* of the excitation hole 45 is arranged. These setback facets 55 and 56 are recessed from the open-circuiting end facet 54 by a predetermined distance. No external conductor 50 is arranged on the open-circuiting end facet 54, whereas the internal conductors 49 formed respectively on the inner peripheral surfaces of the excitation holes 44 and 45 are extended onto the setback facets 55 and 56 so as to become external conductors 50.

On the other hand, as shown in FIGS. 23 and 24, countersinks 52 and 53 to be coated with a conductor are formed respectively at the open-circuiting ends 44*b* and 45*b* of the excitation holes 44 and 45 that are located on the bottom surface 41*b* of the dielectric ceramic block 41. More specifically, the countersink 52 is provided on the open-circuiting end 44*b* of the excitation hole 44 and shows an increased diameter. Similarly, the countersink 53 is provided on the open-circuiting end 45*b* of the excitation hole 45 and shows an increased diameter. The internal conductors 49 formed on the inner peripheral surfaces of the excitation holes 44 and 45 are extended respectively to the inner peripheral surfaces of the countersinks 52 and 53.

Figure 25:
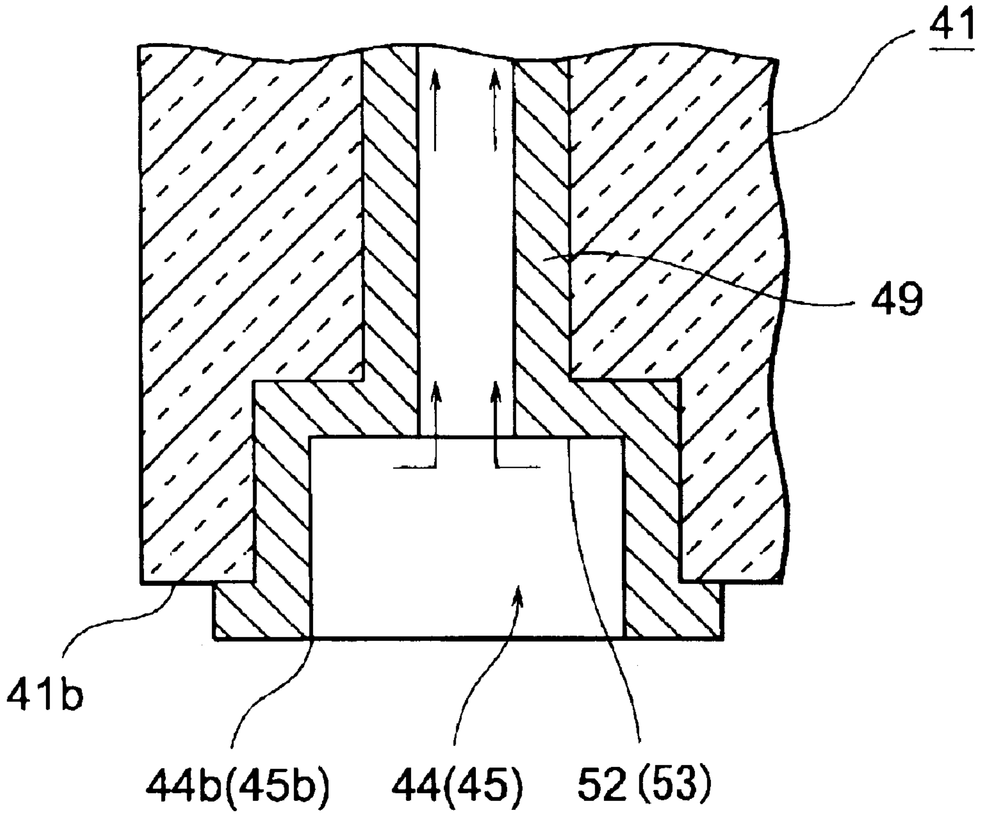
FIG. 25 is an enlarged schematic longitudinal cross sectional view of a component of the dielectric filter F5 of FIG. 21, illustrating the open ends of the excitation hole, whichever appropriate, in the step of applying silver paste.

Now, the process of forming the external conductors 50 on the setback facets 55 and 56 and the internal conductors 49 on the inner peripheral surfaces of the excitation holes 44 and 45 of the dielectric filter F5 will be described with reference to FIGS. 25, 26A and 26B.

Figure 26A:
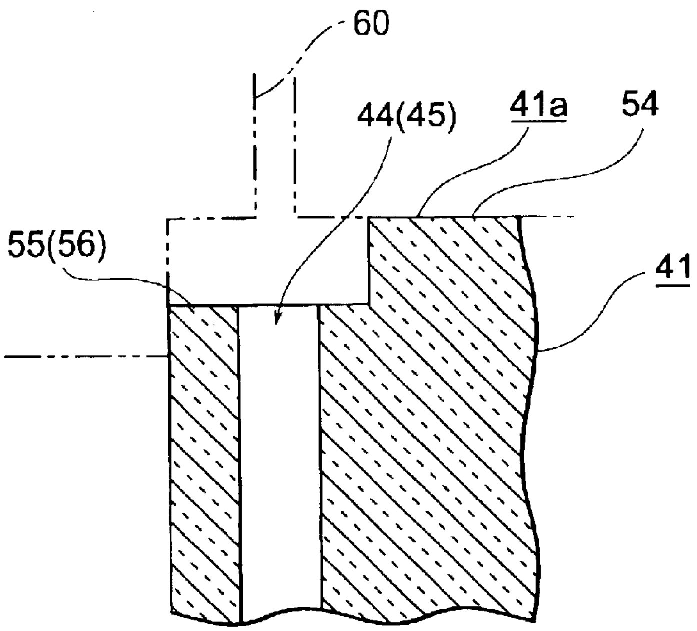
FIG. 26A is an enlarged schematic longitudinal cross section view of a component of the dielectric filter F5 of FIG. 21, illustrating the open ends of the excitation hole, whichever appropriate, in the step of applying silver paste before forming an internal conductor and an external conductor.

Firstly, a vacuum suction system 60 is arranged at the side of the short-circuiting ends 44*a* and 45*a* of the excitation holes 44 and 45 (at the side of the top surface 41*a* of the dielectric ceramic block 41) so as to make the suction surface of the vacuum suction system 60 contact with the open-circuiting end facet 54 of the resonators 42 and 43 (see FIG. 26A). Then, silver paste is drawn by vacuum by means of the vacuum suction system 60 from the side of the open-circuiting ends 44*b* and 45*b* of the excitation holes 44 and 45 (the side of the bottom surface 41*b* of the dielectric ceramic block 41) toward the short-circuiting ends 44*a* and 45*a* of the excitation holes 44 and 45.

Then, silver paste is driven to flow along the inner peripheral surfaces of the excitation holes 44 and 45 so that silver paste is applied to the inner peripheral surfaces of the countersinks 52 and 53 to be coated with a conductor formed at the open ends 44*b* and 45*b* of the excitation holes 44 and 45 and also to the inner peripheral surfaces of the excitation holes 44 and 45. As a result, thin internal conductors 49 of silver paste are uniformly formed on the inner peripheral surfaces of the countersinks 52 and 53 to be coated with a conductor and the inner peripheral surfaces of the excitation holes 44 and 45.

Therefore, the internal conductors 49 are formed on inner peripheral surfaces of the countersinks 52 and 53 arranged at the open-circuiting ends 44*b* and 45*b* of the excitation holes 44 and 45. Consequently, the surface area of the internal conductors 49 of the excitation holes 44 and 45 and hence the effective length of the excitation holes 44 and 45 are significantly increased. Thus, according to the invention, internal conductors 49 can be formed in desired conditions by appropriately selecting a depth, a diameter and a profile for the countersinks 52 and 53 to be coated with a conductor. In other words, it is possible to regulate the effective length of the excitation holes 44 and 45.

Figure 26B:
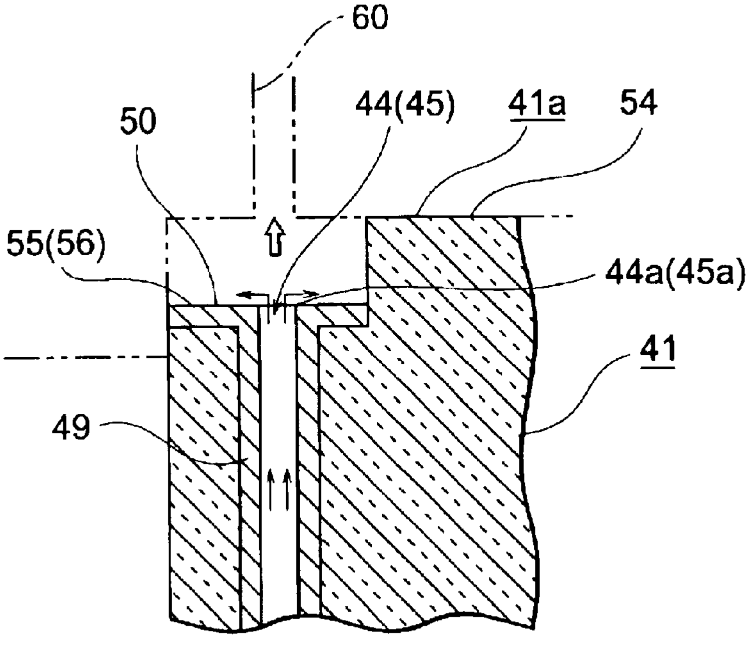
FIG. 26B is an enlarged schematic longitudinal cross section view of a component of the dielectric filter F5 of FIG. 21, illustrating the open ends of the excitation hole, whichever appropriate, in the step of applying silver paste after forming an internal conductor and an external conductor.

On the other hand, an internal conductor 49 is formed appropriately on each of the inner peripheral surfaces of the short-circuiting ends 44*a* and 45*a* of the excitation holes 44 and 45 as shown in FIG. 26B.

Furthermore, drawn silver paste flows horizontally along the setback facets 55 and 56 to be coated with a conductor that are perpendicular relative to the inner peripheral surfaces of the excitation holes 44 and 45.

As the top surface 41*a* of the dielectric ceramic block 41 is made to bear the open-circuiting end facet 54 and setback facets 55 and 56 to be coated with a conductor that are recessed from the facet 54 by a predetermined distance, a gap is produced between the suction surface of the vacuum suction system 60 and the setback facet 55 and 56 to be coated with a conductor. Therefore, each of the external conductors 50 on the setback facets 55 and 56 is formed by silver paste that is drawn by vacuum after passing through the inner peripheral surface of the excitation hole 44 or 45, whichever appropriate. In other words, the internal conductors 49 on the inner peripheral surfaces of the excitation holes 44 and 45 and the external conductors 50 on the setback facets 55 and 56 to be coated with a conductor can be formed in a printing step. Additionally, the setback facets 55 and 56 to be coated with a conductor clearly define the profiles of the external conductors 50 to improve the efficiency of and simplify the step of forming the electrodes.

Figure 27:
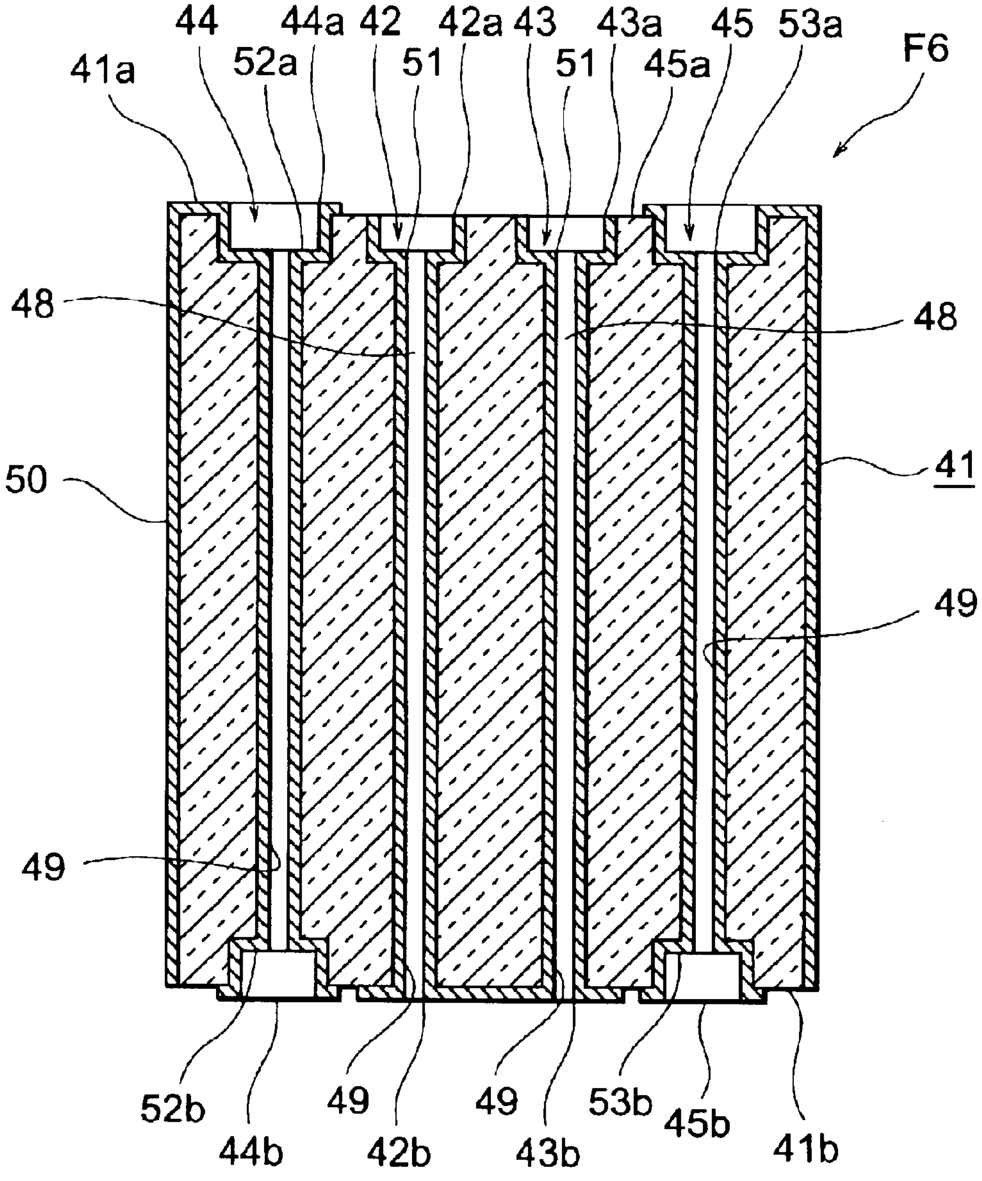
FIG. 27 is a schematic longitudinal cross section view showing a dielectric filter F6 according to the sixth embodiment of the present invention.

FIG. 27 illustrates a dielectric filter F6 according to the sixth embodiment of the present invention. In FIG. 27, the components that are same as those of the fifth embodiment of dielectric filter F5 are denoted respectively by the same reference symbol and will not be described any further.

The illustrated dielectric filter F6 has a substantially rectangularly parallelepipedic profile and comprises resonators 42 and 43 and excitation holes 44 and 45 that are arranged in parallel with each other. The excitation holes 44 and 45 respectively have short-circuiting ends 44*a* and 45*a*, countersinks 52*a* and 53*a* to be coated with a conductor, open-circuiting ends 44*b* and 45*b* and countersinks 52*b* and 53*b* to be coated with a conductor. The countersinks 52*a*, 53*a*, 52*b* and 53*b* have an increased diameter. The countersinks 52*a*, 53*a* are arranged at the short-circuiting ends 44*a* and 45*a*, and the countersinks 52*b* and 53*b* are arranged at the open-circuiting ends 44*b* and 45*b* of the excitation holed 44 and 45.

The open ends 42*a* and 43*a* of the resonators 42 and 43 and the short-circuiting ends 44*a* and 45*a* of the excitation holes 44 and 45 are formed on the top surface 41*a* of the dielectric ceramic block 41. On the other hand, the short-circuiting ends 42*b* and 43*b* of the resonators 42 and 43 and the open-circuiting ends 44*b* and 45*b* of the excitation holes 44 and 45 are formed on the bottom surface 41*b* of the dielectric ceramic block 41. Additionally, the countersinks 52*a* and 53*a* to be coated with a conductor are formed respectively at the short-circuiting ends 44*a* and 45*a* of the excitation holes 44 and 45. The countersinks 52*b* and 53*b* to be coated with a conductor are formed respectively at the open ends 44*b* and 45*b* of the excitation holes 44 and 45.

As a result of forming the countersinks 52*a*, 52*b*, 53*a* and 53*b* to be coated with a conductor having an increased diameter at the respective ends of the excitation holes 44 and 45, an internal conductor 49 can be formed on the short-circuiting ends 44*a* and 45*a* and the open-circuiting ends 44*b* and 45*b* of the excitation holes 44 and 45 in desired conditions. Then, as a result of forming an internal conductor on the inner peripheral surfaces of the countersinks 52*a*, 52*b*, 53*a* and 53*b*, the surface area of the internal conductors 49 of the excitation holes 44 and 45 is increased. The dielectric filter F6 can be made to comprise excitation holes 44 and 45 having a desired effective length by adjusting the profile of the countersinks.

Additionally, since the countersinks 52*a*, 52*b*, 53*a* and 53*b* to be coated with a conductor are formed in the inside of the dielectric ceramic block 41, the outer profile of the dielectric ceramic block 41 is prevented from becoming uneven. Therefore, the use of a conventional printing technique such as screen printing can advantageously be used for the purpose of the invention. Thus, a screen printing technique that is adapted to mass production can be applied to the present invention to avoid a problem of a complex printing process that can entail misregistrations and an increased number of process steps which by turn raise the manufacturing cost.

It should be noted that any dielectric filters comprising excitation holes 44 and 45 at the end of which countersinks 52*a*, 52*b*, 53*a* and 53*b* to be coated with a conductor having an increased diameter are within the scope of the present invention.

The resonators 42 and 43 and/or the excitation holes 44 and 45 may alternatively show a square cross section or a cross section of some other form in each of the above described fifth and sixth embodiments. A dielectric electronic component according to the invention may be a multi-pole type dielectric duplexer or some other device.

In each of the above described embodiments, the number and the profile of the resonators that are arranged in parallel can be modified appropriately. While the present invention is described above in terms of dielectric filters, the present invention is also applicable to other dielectric electronic components such as dielectric duplexers.

Since a dielectric electronic component according to the present invention has coupling-adjusting countersinks formed respectively at the short-circuiting ends of the excitation holes, the input/output coupling can be weakened without increasing the outer dimensions of the dielectric electronic component, which may be a dielectric filter or a dielectric duplexer.

Since a dielectric electronic component according to the present invention has coupling-adjusting countersinks formed respectively at the open-circuiting ends of the excitation holes, the input/output coupling can be strengthened without increasing the outer dimensions of the dielectric electronic component, which may be a dielectric filter or a dielectric duplexer.

Since the extent of input/output coupling can be adjusted by modifying the depth of the coupling-adjusting countersinks, the dielectric electronic component can be made to show desired characteristics, which by turn broaden the scope of application of the present invention because the present invention provides an advantage of meeting a demand for dielectric electronic components with widely varied characteristics.

Since a dielectric electronic component according to the invention has coupling-adjusting setback facets, the input/output coupling can be weakened or strengthened without increasing the outer dimensions of the dielectric electronic component, which may be a dielectric filter or a dielectric duplexer.

Since the extent of input/output coupling can be adjusted by modifying the depth of the coupling-adjusting setback facets, the dielectric electronic component can be made to show desired characteristics, which by turn broaden the scope of application of the present invention because the present invention provides an advantage of meeting a demand for dielectric electronic components with widely varied characteristics.

Since the dielectric ceramic block of a dielectric electronic component according to the invention has a surface that bears an open end facet where the open ends of the resonators are formed and setback facets to be coated with a conductor that are recessed from the open end facet by a predetermined distance, it is possible to integrate the manufacturing where an electrically conductive material is drawn by vacuum and made to flow along the setback facets to be coated so as to be applied thereto after passing through the inner peripheral surfaces of the respective excitation holes and the manufacturing step where an external conductor is formed on each of the setback facets to be coated with a conductor. Additionally, since the profile of the surfaces where an external conductor is to be formed is clearly defined, it is possible to simplify the printing process. As a whole, the present invention provides a remarkable advantage of simplifying the manufacturing process, thereby reducing the manufacturing cost.

When a countersink to be coated with a conductor is formed at each of the open ends of the excitation holes, the total surface area of the internal conductors formed on the inner peripheral surfaces of the excitation holes is increased by the area of the inner peripheral surfaces of the countersinks to be coated with a conductor to consequently increase the effective length of each of the excitation holes. The internal conductors can be made to show a desired surface area by appropriately modifying the profile of the countersinks to be coated with a conductor.

Since a dielectric electronic component according to the invention may have countersinks to be coated with a conductor each of which has an increased diameter and is arranged at an end of one of the excitation holes, the total surface area of the internal conductors formed on the inner peripheral surfaces of the excitation holes is increased by the area of the inner peripheral surfaces of the countersinks to be coated with a conductor. The internal conductors can be formed in desired conditions by appropriately modifying the profile of the countersinks to be coated with a conductor.

Since all the short-circuiting ends and the open ends of the excitation holes of a dielectric electronic component according to the invention may be provided with a countersink to be coated with a conductor, the total surface area of the internal conductors formed on the inner peripheral surfaces of the excitation holes is increased by the area of the inner peripheral surfaces of the countersinks to be coated with a conductor. In other words, the countersinks to be coated with a conductor are formed in the inside of the dielectric ceramic block so that the outer profile of the dielectric ceramic block is prevented from becoming uneven. Therefore, a known printing technique such as screen printing can advantageously be used for coating the outer surfaces of the dielectric ceramic block with an external conductor. Thus, a dielectric electronic component according to the invention is adapted to mass production and hence can be manufactured at low cost.

What is claimed is:

1. A dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the short-circuiting ends of the excitation holes being provided with respective coupling-adjusting countersinks each having an increased diameter.

2. A dielectric electronic component according to claim 1, wherein the electronic component is a dielectric filter.

3. A dielectric electronic component according to claim 1, wherein the electronic component is a dielectric duplexer.

4. A method of adjusting a coupling of a dielectric electronic component according to claim 1, wherein an input/output coupling is adjusted by modifying a depth of each of the coupling-adjusting countersinks.

5. A dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the top surface of the dielectric ceramic block including an open-circuiting end facet defining the open-circuiting ends of the resonators and coupling-adjusting setback facets, said setback facets being recessed by a predetermined distance from the top surface and defining short-circuiting ends of the excitation holes.

6. A dielectric electronic component according to claim 5, wherein the electronic component is a dielectric filter.

7. A dielectric electronic component according to claim 5, wherein the electronic component is a dielectric duplexer.

8. A method of adjusting a coupling of a dielectric electronic component according to claim 5, wherein an input/output coupling is adjusted by modifying a distance by which the coupling-adjusting setback facets are recessed.

9. A dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the open-circuiting ends of the excitation holes being provided with respective coupling-adjusting countersinks each having an increased diameter.

10. A dielectric electronic component according to claim 9, wherein the electronic component is a dielectric filter.

11. A dielectric electronic component according to claim 9, wherein the electronic component is a dielectric duplexer.

12. A method of adjusting a coupling of a dielectric electronic component according to claim 9, wherein an input/output coupling is adjusted by modifying a depth of each of the coupling-adjusting countersinks.

13. A dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

the dielectric ceramic block having a top surface on which open-circuiting ends of the resonators and short-circuiting ends of the excitation holes are defined;

the dielectric ceramic block having a bottom surface on which short-circuiting ends of the resonators and the open-circuiting ends of the excitation holes are defined;

the dielectric ceramic block having an outer peripheral surface coated with an external conductor except regions surrounding the open-circuiting ends of the resonators and those of the excitation holes; and the bottom surface of the dielectric ceramic block including a short-circuiting end facet defining the short-circuiting ends of the resonators and coupling-adjusting setback facets, said setback facets being recessed by a predetermined distance from the bottom surface and defining open-circuiting ends of the excitation holes.

14. A dielectric electronic component according to claim 13, wherein the electronic component is a dielectric filter.

15. A dielectric electronic component according to claim 13, wherein the electronic component is a dielectric duplexer.

16. A method of adjusting a coupling of a dielectric electronic component according to claim 13, wherein an input/output coupling is adjusted by modifying a distance by which the coupling-adjusting setback facets are recessed.

17. A dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

either a top surface or a bottom surface of the dielectric ceramic block being provided with open-circuiting ends of the resonators and short-circuiting ends of the excitation holes;

either the bottom surface or the top surface, whichever appropriate, of the dielectric ceramic block being provided with short-circuiting ends of the resonators and the open-circuiting ends of the excitation holes;

an outer peripheral surface of the dielectric ceramic block being coated with an external conductor except regions surrounding the open-circuiting ends of the resonators and those of the excitation holes; and either the top surface or the bottom surface, whichever appropriate, of the dielectric ceramic block including an open-circuiting end facet that defines the open-circuiting ends of the resonators and setback facets to be coated with a conductor, said setback facets being recessed by a predetermined distance from the top surface or the bottom surface, whichever appropriate, and defining short-circuiting ends of the excitation holes.

18. A dielectric electronic component according to claim 17, wherein the open-circuiting ends of the excitation holes are provided with respective countersinks to be coated with a conductor on either the bottom surface or the top surface of the dielectric ceramic block.

19. A dielectric electronic component according to claim 17, wherein the electronic component is a dielectric filter.

20. A dielectric electronic component according to claim 17, wherein the electronic component is a dielectric duplexer.

21. A dielectric electronic component for a communication device comprising:

a plurality of resonators provided in a dielectric ceramic block, each of which includes a through hole bored through the dielectric ceramic block and having an inner peripheral surface coated with an internal conductor;

a plurality of excitation holes formed in the dielectric ceramic block and electromagnetically coupled with the resonators, each of which has an inner peripheral surface coated with an internal conductor, said resonators and said excitation holes being arranged in parallel with each other;

either a top surface or a bottom surface of the dielectric ceramic block being provided with open-circuiting ends of the resonators and short-circuiting ends of the excitation holes;

either the bottom surface or the top surface, whichever appropriate, of the dielectric ceramic block being provided with short-circuiting ends of the resonators and the open-circuiting ends of the excitation holes;

an outer peripheral surface of the dielectric ceramic block being coated with an external conductor except regions surrounding the open-circuiting ends of the resonators and those of the excitation holes; and one of the opposite ends of each of the excitation holes being provided with a countersink to be coated with a conductor having an increased diameter.

22. A dielectric electronic component according to claim 21, wherein both the short-circuiting end and the open-circuiting end of the opposite ends of each of the excitation holes are provided with a countersink to be coated with a conductor that has an increased diameter.

23. A dielectric electronic component according to claim 21, wherein the electronic component is a dielectric filter.

24. A dielectric electronic component according to claim 21, wherein the electronic component is a dielectric duplexer.

* * * * *